(12) United States Patent
Kong

(10) Patent No.: US 7,528,824 B2
(45) Date of Patent: May 5, 2009

(54) KEYBOARD OR OTHER INPUT DEVICE USING RANGING FOR DETECTION OF CONTROL PIECE MOVEMENT

(75) Inventor: Yuan Kong, Kirkland, WA (US)

(73) Assignee: Microsoft Corporation, Redmond, WA (US)

( * ) Notice: Subject to any disclaimer, the term of this patent is extended or adjusted under 35 U.S.C. 154(b) by 484 days.

(21) Appl. No.: 10/953,107

(22) Filed: Sep. 30, 2004

(65) Prior Publication Data

US 2006/0066576 A1    Mar. 30, 2006

(51) Int. Cl.
*G06F 3/02* (2006.01)

(52) U.S. Cl. .......................... 345/168; 341/22

(58) Field of Classification Search ......... 345/156–184; 341/20–35
See application file for complete search history.

(56) References Cited

U.S. PATENT DOCUMENTS

| | | | |
|---|---|---|---|
| 3,954,335 A | 5/1976 | Bodlaj | |
| 4,240,745 A | 12/1980 | Green | |
| 4,379,968 A | 4/1983 | Ely et al. | |
| 4,417,824 A * | 11/1983 | Paterson et al. | 400/477 |
| 4,641,026 A * | 2/1987 | Garcia, Jr. | 250/229 |
| 4,721,385 A | 1/1988 | Jelalian et al. | |
| 4,794,384 A | 12/1988 | Jackson | |
| 5,114,226 A | 5/1992 | Goodwin et al. | |
| 5,125,736 A | 6/1992 | Vaninetti et al. | |
| 5,274,361 A | 12/1993 | Snow | |
| 5,274,363 A | 12/1993 | Koved et al. | |
| 5,369,262 A | 11/1994 | Dvorkis et al. | |
| 5,475,401 A | 12/1995 | Verrier et al. | |
| 5,510,604 A | 4/1996 | England | |
| 5,515,045 A * | 5/1996 | Tak | 341/23 |
| 5,629,594 A * | 5/1997 | Jacobus et al. | 318/568.11 |
| 5,781,297 A | 7/1998 | Castore | |
| 5,808,568 A | 9/1998 | Wu | |
| 5,994,710 A | 11/1999 | Knee et al. | |

(Continued)

FOREIGN PATENT DOCUMENTS

EP    1107101 A2    6/2001

(Continued)

OTHER PUBLICATIONS

Wu, Qingguang, et al., *"New Vibrometer Using Self-Mixing Laser Diode Modulated with triangular Current"*, Shizuoka University, Cleo/Pacific Rim/, pp. 290-291 (1997).

(Continued)

*Primary Examiner*—Richard Hjerpe
*Assistant Examiner*—Christopher E Leiby
(74) *Attorney, Agent, or Firm*—Merchant & Gould P.C.

(57) ABSTRACT

A keyboard detects press or release of keys using one or more ranging techniques. Targets are attached to keys of the keyboard. As keys are pressed or released, attached targets move into paths of distance measuring sensors. A range finder determines sensor-target distances and reports those distances to a microprocessor. Based on that distance data, the microprocessor identifies the moved keys. The keys and microprocessor are configured to determine the direction of key motion and to detect simultaneous press or release of keys in a single row or column. A slider control, and/or an integral pointing device tracking motion of a user's finger or other object, may also be included.

26 Claims, 31 Drawing Sheets

U.S. PATENT DOCUMENTS

| | | | |
|---|---|---|---|
| 6,015,089 | A | 1/2000 | Hecht et al. |
| 6,040,914 | A | 3/2000 | Bortz et al. |
| 6,246,482 | B1 | 6/2001 | Kinrot et al. |
| 6,300,940 | B1* | 10/2001 | Ebina et al. ............... 345/161 |
| 6,303,924 | B1 | 10/2001 | Adan et al. |
| 6,333,735 | B1 | 12/2001 | Anvekar |
| 6,373,047 | B1 | 4/2002 | Adan et al. |
| 6,489,934 | B1 | 12/2002 | Klausner |
| 6,525,677 | B1 | 2/2003 | Printzis |
| 6,552,713 | B1* | 4/2003 | Van Brocklin et al. ...... 345/157 |
| 6,585,158 | B2 | 7/2003 | Norskog |
| 6,646,723 | B1 | 11/2003 | Dubovitsky et al. |
| 6,687,274 | B2 | 2/2004 | Kahen |
| 6,707,027 | B2* | 3/2004 | Liess et al. ............... 250/221 |
| 6,868,433 | B1 | 3/2005 | Philyaw |
| 6,872,931 | B2 | 3/2005 | Liess et al. |
| 6,903,662 | B2 | 6/2005 | Rix et al. |
| 7,085,584 | B2 | 8/2006 | Shima |
| 7,138,620 | B2 | 11/2006 | Trisnadi et al. |
| 7,268,705 | B2 | 9/2007 | Kong |
| 7,283,214 | B2 | 10/2007 | Xu et al. |
| 2001/0035861 | A1 | 11/2001 | Ericson et al. |
| 2001/0055195 | A1* | 12/2001 | Suzuki ................... 361/680 |
| 2002/0117549 | A1 | 8/2002 | Lee |
| 2002/0130183 | A1 | 9/2002 | Vinogradov et al. |
| 2002/0158838 | A1 | 10/2002 | Smith et al. |
| 2002/0198030 | A1 | 12/2002 | Shima |
| 2003/0006367 | A1 | 1/2003 | Liess et al. |
| 2003/0085284 | A1 | 5/2003 | Bremer et al. |
| 2003/0085878 | A1 | 5/2003 | Luo |
| 2003/0128188 | A1 | 7/2003 | Wilbrink et al. |
| 2003/0128190 | A1 | 7/2003 | Wilbrink et al. |
| 2003/0132914 | A1 | 7/2003 | Lee |
| 2003/0136843 | A1 | 7/2003 | Ralph et al. |
| 2003/0142288 | A1 | 7/2003 | Kinrot et al. |
| 2004/0004128 | A1 | 1/2004 | Pettinelli et al. |
| 2004/0004603 | A1 | 1/2004 | Gerstner et al. |
| 2004/0075823 | A1 | 4/2004 | Lewis et al. |
| 2004/0095323 | A1 | 5/2004 | Ahn |
| 2004/0109019 | A1* | 6/2004 | Miyamoto et al. .......... 345/741 |
| 2004/0213311 | A1 | 10/2004 | Johnson et al. |
| 2004/0227954 | A1 | 11/2004 | Xie |
| 2004/0228377 | A1 | 11/2004 | Deng et al. |
| 2004/0246460 | A1 | 12/2004 | Auracher et al. |
| 2005/0007343 | A1 | 1/2005 | Butzer |
| 2005/0044179 | A1 | 2/2005 | Hunter |
| 2005/0068300 | A1 | 3/2005 | Wang et al. |
| 2005/0134556 | A1 | 6/2005 | Van Wiggeren et al. |
| 2005/0156875 | A1 | 7/2005 | Kong |
| 2005/0157202 | A1 | 7/2005 | Lin et al. |
| 2005/0168445 | A1 | 8/2005 | Piot et al. |
| 2005/0179658 | A1 | 8/2005 | Huang et al. |
| 2005/0231484 | A1 | 10/2005 | Gordon et al. |
| 2005/0243055 | A1* | 11/2005 | Ranta et al. ............... 345/156 |
| 2006/0213997 | A1 | 9/2006 | Frank et al. |
| 2006/0245518 | A1 | 11/2006 | Wang |
| 2006/0262096 | A1 | 11/2006 | Panabaker et al. |
| 2007/0002013 | A1 | 1/2007 | Kong et al. |
| 2007/0102523 | A1 | 5/2007 | Kong |
| 2007/0109267 | A1 | 5/2007 | Guo et al. |
| 2007/0109268 | A1 | 5/2007 | Guo et al. |

FOREIGN PATENT DOCUMENTS

| | | |
|---|---|---|
| GB | 2383231 A | 6/2003 |
| WO | WO 00/28455 | 5/2000 |
| WO | WO 2005/076116 A2 | 8/2005 |

OTHER PUBLICATIONS

Tsukuda, Naoki, et al., "*New Range-Finding Speedometer Using a Self-Mixing Laser Diode Modulated by Triangular Wave Pulse Current*", Shizuoka University, Weam 4-1, (1994), pp. 332-335.

Besnard, Pascal, et al., "*Microwave Spectra In External-Cavity Semiconductor Lasers: Theoretical Modeling of Multipass Resonances*", IEEE Journal of Quantum Electronics, pp. 1713-1722, (Aug. 1994) vol. 30, No. 8.

Besnard, Pascal, et al., "*Feedback Phenomena in a Semiconductor Laser Induced by Distant Reflectors*", IEEE Journal of Quantum Electronics, pp. 1271-1284, (May 1993) vol. 29, No. 5.

Short Talk: Fitt's Law & Text Input, New Horizons, "*Interface with Pre-Typing Visual Feedback for Touch Sensitive Keyboard*", pp. 750-751, CHI 2003.

Bazin, G., et al., "*A New Laser Range-Finder Based on FMCW-Like Method*", IEEE Instrumentation and Measurement Technology Conference, (1996), pp. 90-93.

Peng, Gang, et al., "*Design of 3-D Mouse Using Ultrasonic Distance Measurement*", International Conference on Sensors and Control Techniques, pp. 226-229, (2000), Proceedings of SPIE, vol. 4077.

Shinohara, Shigenobu, et al., "*High-Resolution Range Finder with Wide Dynamic Range of 0.2m to 1m Using a Frequency-Modulated Laser Diode*", pp.646-651, (1989), IEEE.

Bosch, Thierry, et al., "*Three-Dimensional Object Construction Using a Self-Mixing Type Scanning Laser Range Finder*", pp. 1326-1329, (1998), IEEE Transactions on Instrumentation and Measurement, vol. 47, No. 5.

Dorsch, Rainer G., et al., "*Laser Triangulation; Fundamental Uncertainty in Distance Measurement*", pp. 1306-1314, (1994), Applied Optics, vol. 33, No. 7.

Dupuy, D., et al., "*A FMCW Laser Range-Finder Based on a Delay Line Technique*", pp. 1084-1088, (2001), IEEE Instrumentation and Measurement Technology Conference.

Journet, B., et al., "*High Resolution Laser Range-Finder Based on Phase-Shift Measurement Method*", pp. 123-132, (1998), SPIE vol. 3520.

Favre-Bulle, Bernard, et al., "*Efficient Tracking of 3D—Robot Positions by Dynamic Triangulation*", pp. 446-449, (1998), IEEE ITMC Session on Instrumentation and Measurement in Robotics.

Bosch, T. et al., "*A Low-Cost, Optical Feedback Laser Range-Finder with Chirp Control*", (2001), IEEE Instrumentation and Measurement Technology Conference.

Tucker, John, "*Laser Range Finder Using the Self-Mixing Effect in a Vertical Cavity Surface Emitting Laser*" (VCSEL), pp. 1-71, (2001).

De Groot, Peter, et al., "*Chirped Synthetic-Wavelength Interferometry*", pp. 1626-1628, (1992), Optics Letters, vol. 17, No. 22.

Gelmini, E, et al., "*Tunable, Double-Wavelength Heterodyne Detection Interferometer for Absolute-Distance Measurements*", pp. 213-215, (1994), Optics Letters, vol. 19, No. 3.

IBM Technical Disclosure Bulletin, "*Ultrasonic Cursor Position Detection*", pp. 6712-6714, (1985), vol. 27, No. 11.

Tucker, J.R., et al., "*Laser Range Finding Using the Self-Mixing Effect in a Vertical-Cavity Surface Emitting Laser*", pp. 583-586, (2002), Conference on Optoelectronic and Microelectronic Materials and Devices.

Journet, B., et al., "*A Low-Cost Laser Range Finder Based on an FMCW-Like Method*", pp. 840-843, (2000), IEEE Transactions on Instrumentation and Measurement, vol. 49, No. 4.

Marques, Lino, et al., "*3D Laser-Based Sensor for Robotics*", pp. 1328-1331, (1994), ISR—Institute of Systems and Robotics.

Marques, Lino, et al., "*A New 3D Optical Triangulation Sensor for Robotics*", pp. 512-517, (1998), IEEE International Workshop on Advanced Motion Control.

Preucil, Libor, "*Building a 2D Environment Map From Laser Range-Finder Data*", pp. 290-295, (2000), IEEE Intelligent Vehicles Symposium.

Nyland, Lars S., et al., "*Capturing, Processing and Rendering Real-World Scenes*", IEEE, 2001.

Onodera, Ribun, et al., "*Effect of Laser-Diode Power Change on Optical Heterodyne Interferometry*", pp. 675-681, (1995), Journal of Lightwave Technology, vol. 13, No. 4.

Besesty, Pascal, et al., "*Compact FMCW Advanced Laser Range Finder*", pp. 552-553, (1999) Technical Digest: Conference on Lasers and Electro-Optics.

Poujouly, Stephane, et al., "*Digital Laser Range Finder, Phase-Shift Estimation by Undersampling Technique*", pp. 1312-1317, (1999), IEEE.

Zheng, Jiang A., "*A Flexible Laser Range Sensor Based on Spatial-Temporal Analysis*", (2000), Proceedings of the International Conference on Pattern Recognition.

Dandliker, R., et al., "*Two-Wavelength Laser Interferometry Using Superheterodyne Detection*", pp. 339-341, Optics Letters, (1998) vol. 13, No. 5.

Zou, Q., et al., "*Silicon Capacitive Microphones with Corrugated Diaphragms*", School of Mechanical and Production Engineering, Nanyang Technological University; date of first publication unknown, but believed prior to Sep. 30, 2003.

Rombach, Pirmin, et al., *A Low-Voltage Silicon Condenser Microphone for Hearing Instrument Applications, Microtronic A/S*; date of first publication unknown, but believed prior to Sep. 30, 2003.

Shinoda, Yukitaka, et al., "*Real-Time Computation of Distance and Displacement by Software Instruments Using Optical Frequency Modulation*", pp. 82-83, (2002), SICE.

Cole, Timothy, et al., "*Flight Characterization of the Near Laser Rangefinder*", pp. 131-142, (2000), Lasar Radar technology and Applications, Proceedings of SPIE vol. 4035.

Viarani, Luigi, et al., "*A CMOS Smart Pixel for Active 3-D Vision Applications*", pp. 145-152, (2004), IEEE Sensors Journal, vol. 4, No. 1.

Wakitana, Jun, et al. "*Wrist-Mounted Laser Rangefinder*", pp. 362-367, (1995) Proceedings of the International Conference on Intelligent Robots and Systems.

Zahid, M., et al., "*High-Frequency Phase Measurement for Optical Rangefinding System*", pp. 141-148, (1997), IEEE Proceedings Science and Measurements Technology, vol. 144, No. 3.

Whetstone, Albert, "*Free-Hand Data Input*", pp. 11-28, Science Accessories Corporation (1970).

Acroname Articles, Demystifying the Sharp IR Rangers, http://www.acroname.com/robotics/info/articles/sharp/sharp.html (First published before Sep. 14, 2004).

Gagnon, Eric, "*Laser Range Imaging Using the Self-mixing Effect in a Laser Diode*", pp. 693-699, (1999), IEEE Transaction on Instrumentation and Measurement, vol. 48, No. 3.

Canesta, Inc., "*Data Input Alternatives for Mobile Devices*", pp. 1-5, Nov. 28, 2002.

Steinmetz, Robert, et al. "*Solving the Data Input Problem in Mobile Devices*", pp. 1-6, Sep. 2002.

Tomasi, Carlo et al., "*Full Size Projection Keyboard for Handheld Devices*", pp. 70-75, (2003) Communications of the ACM, vol. 46, No. 7.

Hebert, Martial, "*Active and Passive Range Sensing for Robotics*", pp. 102-110, (2000) IEEE International Conference of Robotics and Automation.

"Laser-Based Tracking for Real-Time 3D Gesture Acquisition", http://www.k2.t.u-tokyo.ac.jp/fusion/LaserActiveTracking/index-e.html; first published on or before Aug. 3, 2004.

Aeroflex Mixed-Signal Asics, "Choosing an Ultrasonic Sensor for Proximity or Distance Measurement", Part 1: Acoustic Considerations http://www.sensorsmag.com/articles/0299/acou0299/main.shtml; first published in 1999.

Aeroflex Mixed-Signal Asics, "Choosing an Ultrasonic Sensor for Proximity or Distance Measurement", Part 2: Optimizing Sensor Selection http://www.sensormag.com/articles/0399/0399_28/main.shtml; first published in 1999.

Canesta Keyboard http://www.canesta.com/cansetakeyboard.htm; first published on or after Aug. 3, 2004.

Canesta Keyboard, http://www.canesta.com/faq.htm; first published on or after Aug. 3, 2004.

T. Bosch, et al., "The Self-Mixing Interference Inside a Laser Diode: Application to Displacement, Velocity and Distance Measurement", Proc. SPIE, vol. 3478, pp. 98-108, Jul. 1998.

Shigenobu Shinohara, et al., "Compact and High-Precision Range Finder with Wide Dynamic Range and its Application", IEEE Transactions on Instrumentation and Measurement, vol. 41, No. 1, pp. 40-44, Feb. 1992.

Roland E. Best, "Phase-Locked Loops, Theory, Design, and Applications", McGraw-Hill Book Company, pp. 151-164, 1984 (15 pages).

H. Yeh, et al., "Localized Fluid Flow Measurements with an He-Ne Laser Spectrometer", Appl. Phys. Lett., vol. 4, No. 10, pp. 176-178, May 15, 1964.

S.W. James, et al., "Fiber Optic Based Reference Beam Laser Doppler Velocimetry", Optics Communications, 119, pp. 460-464, Sep. 15, 1995.

M.J. Rudd, "A New Theoretical Model for the Laser Dopplemeter", J. Phys. E2, pp. 56-58, 1969.

M.J. Rudd, "A Laser Doppler Velocimeter Employing the Laser as a Mixer-Oscillator", J. Phys. E1, Series 2, vol. 1, pp. 723-726, Feb. 21, 1968.

T. Ito, et al., "Integrated Microlaser Doppler Velocimeter", J. Lightwave Tech., vol. 17, No. 1, pp. 30-34, Jan. 1999.

E.T. Shimizu, "Directional Discrimination in the Self-Mixing Type Laser Doppler Velocimeter", Appl. Opt., vol. 25, No. 21, pp. 4541-4544, Nov. 1987.

S.K. Ozdemir, et al., "New Speckle Velocimeter Using Two Self-Mixing Laser Diodes", SICE 115C-3, pp. 947-950, Jul. 29-31, 1997.

S.L. Toh, et al., "Whole Field Surface Roughness Measurement by Laser Speckle Correlation Technique", Optics and Laser Technology, 33, pp. 427-434, Jun. 5, 2001.

M. Nagahara, et al., "Real-Time Blood Velocity Measurements in Human Retinal Vein Using the Laser Speckle Phenomenon", Japanese Journal of Ophthalmology, 43, pp. 186-195, 1999.

T. Shibata, et al., "Laser Speckle Velocimeter Using Self-Mixing Laser Diode", IEEE Transactions on Instrumentation and Measurement, vol. 45, No. 2, pp. 499-503, Apr. 2, 1996.

S. Kato, et al., "Optical Fibre Laser Doppler Velocimetry Based on Laser Diode Frequency Modulation", Optical and Laser Technology, vol. 27, No. 4, pp. xii, 1995.

W.H. Stevenson, "Optical Frequency Shifting by means of a Rotating diffraction Grating", Appl. Opt. 9, vol. 9, No. 3, pp. 649-652, Mar. 1970.

M.K. Mazumber, et al., "Laser Doppler Velocity Measurement Without Directional Ambiguity By Using Frequency Shifted Incident Beams", Appl. Phys. Lett., vol. 16, No. 1, pp. 462-464, Jun. 1, 1970.

S. Shinohara, et al., "Laser Doppler Velocimeter Using the Self-Mixing Effect of a Semiconductor Laser Diode", Appl. Opt., vol. 25, No. 9, pp. 1417-1419, 1986.

H.W. Jentink, et al., "Small Laser Doppler Velocimeter Based on the Self-Mixing Effect in a Diode Laser", Appl. Opt. vol. 27, No. 2, pp. 379-385, Jan. 15, 1998.

S. Shinohara, et al., "Acquisition of 3-D Image of Still or Moving Objects Utilizing Laser Diode Range-Finding Speedometer", IEEE, pp. 1730-1735, 1993.

L. Fabiny, et al., "Interferometric Fiber-Optic Doppler Velocimeter with High-Dynamic Range", IEEE Photonics Tech. Lett., vol. 9, No. 1, pp. 79-81, Jan. 1997.

S. Shinohara, et al., "Detection of Mesa Spots and Indents on Slowly Moving Object Surface by Laser-Light Beam Scanning", SICE, 105C-5, pp. 1167-1170, Jul. 26-28, 1995.

Y. Kakiuchi, et al., "Measurement of Small Vibrational Displacement by SM LD Vibrometer with Resonance Element", SICE, 107 A-4, pp. 903-906, Jul. 29-31, 1998.

Roy Lang, et al., "External Optical Feedback Effects on Semiconductor Injection Laser Properties", IEEE Journal of Quantum Electronics, vol. QE-16, No. 3, pp. 347-355, Mar. 3, 1980.

Acket, G., et al., "The Influence of Feedback Intensity on Longitudinal Mode Properties and Optical Noise in Index-Guided Semiconductor Lasers", IEEE Journal of Quantum Electronics, vol. QE-20, No. 10, pp. 1163-1169, Oct. 1984.

P.J. de Groot, et al., "Ranging and Velocimetry Signal Generation in a Backscatter-Modulated Laser Diode", Appl. Opt., vol. 27, No. 21, pp. 4475-4480, Nov. 1988.

P.A. Porta, "Laser Doppler Velocimetry by Optical Self-Mixing in Vertical-Cavity Surface-Emitting Lasers", IEEE Photonics Technology Letters, vol. 14, No. 12, pp. 1719-1721, Dec. 2002.

S.K. Ozdemir, et al., "Effect of Linewidth Enhancement Factor on Doppler Beat Waveform Obtained From a Self-Mixing Laser Diode", Optical Review, vol. 7, No. 6, pp. 550-554, Jun. 22, 2000.

S. Shinohara, et al., "Compact and Versatile Self-Mixing Type Semiconductor Laser Doppler Velocimeters with Direction-Discrimination Circuit", IEEE Transactions on Instrumentation and Measurement, vol. 38, No. 2, pp. 574-577, Apr. 1989.

James H. Chumside, "Laser Doppler Velocimetry by Modulating a $CO_2$ Laser with Backscattered Light", Appl. Opt., vol. 23, No. 1, pp. 61-66, Jan. 1984.

M.H. Koelink, et al., "Laser Doppler Velocimeter Based on the Self-Mixing Effect in a Fiber-Coupled Semiconductor Laser. Theory", Appl. Opt., vol. 31, No. 18, pp. 3401-3408, Jun. 20, 1992.

W.M. Wang, et al., "Self-Mixing Interference in a Diode Laser: Experimental Observations and Theoretical Analysis", Appl. Opt., vol. 32, No. 9, pp. 1551-1558, Mar. 20, 1993.

Guido Giuliani, et al., "Laser Diode Self-Mixing Technique for Sensing Applications", J. Opt. A: Pure Appl. Opt, 4, vol. 4, No. 6, pp. S283-S294, Nov. 4, 2002.

Richard C. Addy, et al., "Effects of External Reflector Alignment in Sensing Applications of Optical Feedback in Laser Diodes", IEEE Journal of Lightwave Technology, December, vol. 14, No. 12, pp. 2672-2676, Dec. 1996.

S.F. Yu, "Theoretical Analysis of Polarization Bistability in Vertical Cavity Surface Emitting Semiconductor Lasers", IEEE Journal of Lightwave Technology, vol. 15, No. 6, pp. 1032-1041, Jun. 1997.

F. Robert, et al., "Polarization Modulation Dynamics of Vertical-Cavity Surface-Emitting Lasers with an Extended Cavity", IEEE Journal of Quantum Electronics, vol.33, No. 12, 2231-2239, Dec. 1997.

J. Danckaert, et al., "Minimal Rate Equations Describing Polarization Switching in Vertical-Cavity Surface-Emitting Lasers", Optics Communications, vol. 201, pp. 129-137, Jan. 2002.

J. Martin-Regalado, et al., "Polarization Properties of Vertical-Cavity Surface-Emitting Lasers", IEEE Journal of Quantum Electronics, vol. 33, No. 5, pp. 765-783, May 1997.

S. Donati, et al., "Laser Diode Feedback Interferometer for Measurement of Displacements Without Ambiguity", IEEE Journal of Quantum Electronics, vol. 31, No. 1, pp. 113-119, Jan. 1995.

K. Petermann, et al., "External Optical Feedback Phenomena in Semiconductor Lasers", IEEE Journal of Selected Topics in Quantum Electronics, vol. 1, No. 2, pp. 480-489, Jun. 1995.

W.M. Wang, et al., "Self-Mixing Interference Inside a Single-Mode Diode Laser for Optical Sensing Applications", Journal of Lightwave Technology, vol. 12, No. 9, pp. 1577-1587, Sep. 1994.

Ozdemir, Sahin Kaya, et al., "Velocity Measurement by a Self-Mixing Laser Diode Using Speckle Correlation", IEEE, pp. 1756-1760, 1999.

"Optical Mouse Saves Space", <http://www.optics.org/articles/news/8/6/23/1>, date of first publication unknown, but believed to be Jun. 26, 2002.

Hewett, Jacqueline, "Holey VCSELs Produce High Powers", <http://www.optics.org/articles/news/10/12/5/1>, date of first publication unknown, but dated Dec. 2004; 2 pages.

"Ultra-miniature Laser Displacement Sensors", <http://www.globalspec.com/FeaturedProducts/Detail/BaumerElectric/Ultraminiature_Laser_Displacement_Sensors/13470/1>, first date of publication unknown, but prior to Sep. 12, 2005, 2 pages.

Nerin, P., et al., "Absolute Distance and Velocity Measurements by the FMCW Technique and Self-Mixing Interference Effect Inside a Single-Mode Nd:YAG-LiTAO₃Microchip Laser", Journal of Optics, vol. 29, No. 3, Jun. 1998.

Lowery, James, et al., "Design and Simulation of a Simple Laser Rangefinder Using a Semiconductor Optical Amplifier-Detector", Optics Express, vol. 13, No. 10, May 16, 2005; pp. 3647-3652.

Maier, T., et al., "A Compact Sensor for Interferometric Displacement Measurements", <http://www.fke.tuwien.ac.at/Publications/jb/fdjb99/tm.htm>, first date of publication unknown, but dated 1999, 2 pages.

"Laser Sensors Offer Long Stand-off and Measurement Range", ThomasNet Industrial news Room, <http://www.news.thomasnet.com/fullstory/458005/1782>, date of first publication unknown, but dated Dec. 3, 2004, 5 pages.

Logitech® G7 Laser Cordless Mouse; <http://www.logitech.com/index.cfm/products/details/US/EN, CRID=2135,CONTENTID=10716>; date of first publication unknown, but on or before Oct. 24, 2005; 3 pages.

Logitech® MX™ 1000 Laser Cordless Mouse; <http://www.logitech.com/index.cfm/products/details/US/EN,CRID=3,CONTENTID=9043,a d=g03&srch=1>; date of first publication unknown, but on or before Oct. 24, 2005; 3 pages.

5-Button USB Laser Mouse; <http://www.iogear.com/main.php?loc=product&item=GME521>; date of first publication unknown, but on or before Oct. 24, 2005; 3 pages.

Houghton, Andrew, et al., "A Method for Processing Laser Speckle Images to Extract High-Resolution Motion" pp. 611-617, Meas. Sci. Technol. 8 (1997), published Feb. 24, 1997.

Yamaguchi, Ichirou, et al., "Stabilized and Accelerated Speckle Strain Gauge", SPIE Conference on Laser Interferometry: Quantitative Analysis of Interferograms: Third in a Series, Aug. 1989; published Sep. 22, 1991; 8 pages.

Taka, Nobukatsu, et al., Displacement Measurement of Speckles Using a 2-D Level-cross Technique, Applied Optics, vol. 22, No. 22, published Nov. 15, 1983; pp. 3514-3519.

Shaked, Doron, et al., "Graphical Indicia", 2.2 Barcode-Reading Sub-System, <http://www.hpl.hp.com/research/isl/vsb/GraphIndicialCIP.pdf>, first date of publication unknown but, on or before Oct. 13, 2005, 4 pages.

Tsaur, Jiunnjye, et al., "2D Micro Scanner Actuated by Sol-gel Derived Double Layered PZT", National Institute of Advanced Industrial Science and Technology (AIST), <http://toshi.fujita3.iis.u-tokyo.ac.jp/Optical_MEMS_Archives/MEMS%202002/Book/135.PDF>, first date of publication unknown, but on or before 2002, pp. 548-551.

Sasaki, Minoru, et al., "Optical Scanner on a Three-Dimensional Microoptical Bench", Journal of Lighwave Technology, vol. 21, Issue 3, 602, Mar. 2003, <http://jlt.osa.org/abstract.cfm?id=72540>, 1 page.

Liess, Martin, et al., "A Miniaturized Multidirectional Optical Motion Sensor and Input Device Based on Laser Self-Mixing", Meas. Sci. Technol. 13, 2001-2006; <http://www.iop.org/EJ/abstract/0957-0233/13/12/327>, Nov. 1, 2002; Issue 12; 2 pages.

Gokturk, S. Burak, et al., "A Time-Of-Flight Depth Sensor—System Description, Issues and Solutions," cvprw, p. 35, 2004 Conference on Computer Vision and Pattern Recognition Workshop (CVPRW'04), vol. 3, 2004, 9 pages.

"How Does 3DV's Technology Work?", <http://www.3dvsystems.com/technology/technology.html>, first date of publication unknown but on or before Oct. 13, 2005, 7 pages.

Gokturk, Salih Burak, et al., "3D Head Tracking Based on Recognition and Interpolation Using a Time-of-Flight Depth Sensor," cvpr, pp. 211-217, 2004 IEEE Computer Society Conference on Computer Vision and Pattern Recognition (CVPR'04)—vol. 2 2004 7 pages.

Dupuy et al., "Improvement of the FMCW Laser Range-Finder by an APD Working as an Optoelectronic Mixer", IEEE Transactions on Instrumentation and Measurement, 51, 5, pp. 1010-1014, 2002.

Griffiths et al., "Cavity-Resonant Optical Position Sensor-a New Type of Optical Position Sensor", CLEO, 1998, p. 328.

Nokia 7110 Phone Features, www.nokia.com/nokia/0,87643598,00.html, Aug. 23, 2005, 3 pp.

Sony Ericsson Mobile Communications-Home Page-Sony Ericsson-T206, www//sonyericsson.co/spg.jspcc=global&Ic=en=&ver=4001&template=ps1_1_5_4&zone=ps&lm=ps1_1&pid=9946, Aug. 23, 2005, 2 pp.

U.S. Official Action mailed Jun. 26, 2007 in U.S. Appl. No. 11/087,263.

U.S. Official Action mailed Nov. 14, 2007 in U.S. Appl. No. 11/087,263.

U.S. Official Action mailed May 2, 2008 in U.S. Appl. No. 11/135,061.

U.S. Official Action mailed Jun. 25, 2008 in U.S. Appl. No. 11/272,415.

U.S. Official Action mailed Jul. 15, 2008 in U.S. Appl. No. 11/170,182.
U.S. Office Action mailed Jun. 13, 2008 in U.S. Appl. No. 11/170,182.
U.S. Office Action mailed Jul. 15, 2008 in U.S. Appl. No. 11/170,182.
Poujouly et al., "Digital Laser Range Finder: Phase-Shift Estimation by Undersampling Technique", IEEE, 1999, pp. 1312-1317.

U.S. Office Action mailed Oct. 20, 2008 in U.S. Appl. No. 11/268,747.
U.S. Office Action mailed Dec. 30, 2008 in U.S. Appl. No. 11/170,182.

* cited by examiner

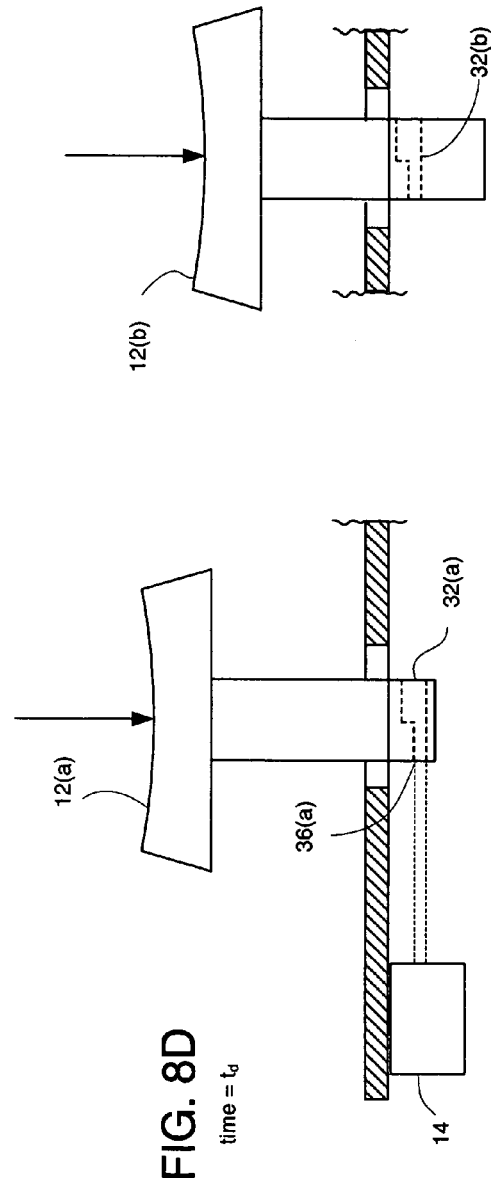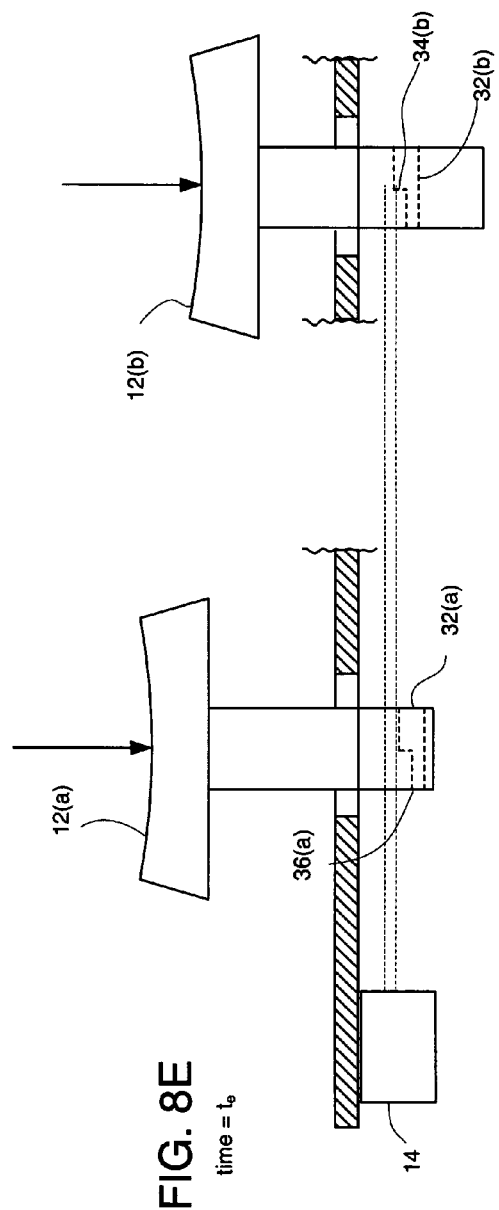

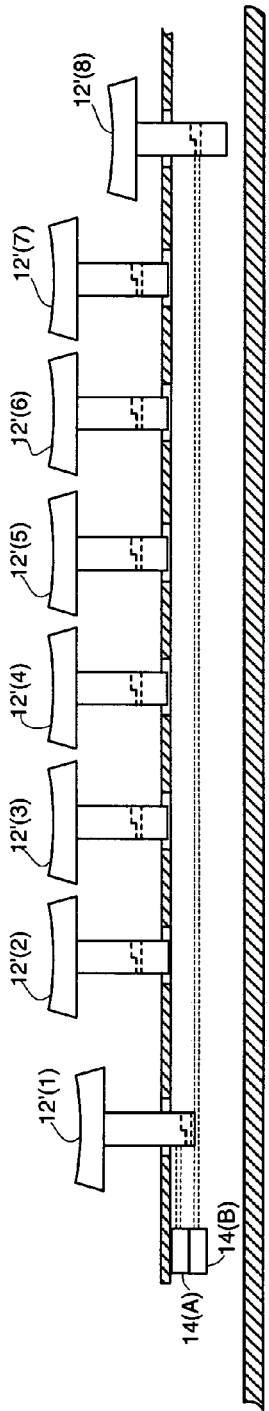
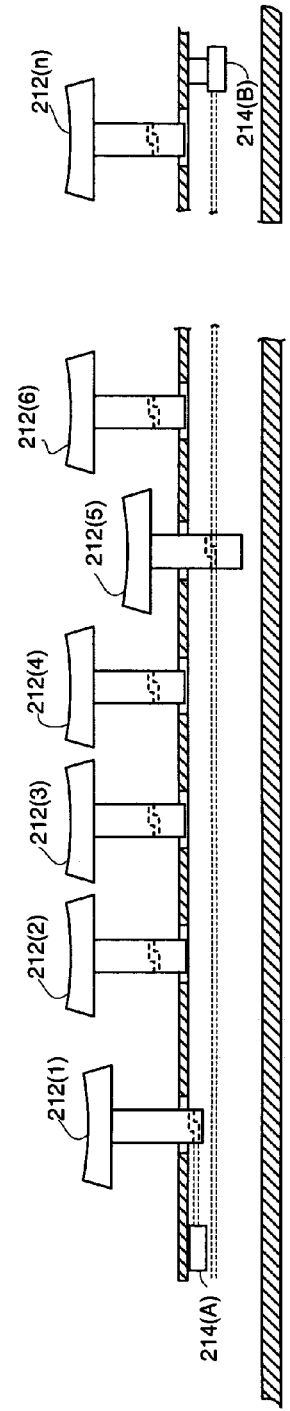

KEYBOARD OR OTHER INPUT DEVICE USING RANGING FOR DETECTION OF CONTROL PIECE MOVEMENT

FIELD OF THE INVENTION

This invention relates to computer input devices. In particular, this invention relates to keyboards and other computer input devices and manners in which actuation of a key or other user control component may be detected.

BACKGROUND OF THE INVENTION

The keyboard is an import tool for providing textual, command and other input to a computer or other electronic device. Although pointing devices (e.g., mice, touchpads, etc.), handwriting detectors (e.g., electronic digitizers and styli) and other input mechanisms continue to develop and offer numerous advantages in many situations, the keyboard will remain a primary input device for the foreseeable future. As critical as keyboards are, however, the basic design has remained the same for many years. In particular, a keyboard generally includes a matrix of electrical switches resting beneath a collection of keys. When a key is pressed, an electrical contact is made in the corresponding switch. A microprocessor periodically scans the switch matrix, and upon detecting a switch closure or opening, signals a press or release of a corresponding key.

Some alternative keyboard technologies have been developed. For example, U.S. patent applications having publication nos. 20030128190 and 20030128188 describe a system whereby an image of a keyboard is displayed on a surface in front of a handheld computing device. Radar or other type of sensor within the computing device then detects a press of a projected "virtual" key when the user's finger is in the region corresponding to a projection of that key. Similar technology has been advertised by Canesta, Inc. of San Jose, Calif. Although useful, such technology is not a complete substitute for a mechanical keyboard. For example, many users rely on the tactile sensation of pressing keys; virtual keyboards do not offer this feature. Moreover, projected keyboards require a flat surface in order to function, and may not operate well in strong ambient lighting conditions.

Conventional keyboard technology limits the degree to which keyboard manufacturing costs can be reduced. A new key detection technology reducing or eliminating the need for a switch matrix, but maintaining the presence of actual keys providing a suitable tactile response and/or not affected by strong ambient light, would offer a significant advantage. Elimination of a switch matrix would also allow greater flexibility in changing the size and/or shape of a keyboard. For these and other reasons, there remains a need for new ways in which a key press of a mechanical keyboard (or other movement of a user control) may be detected.

SUMMARY OF THE INVENTION

In at least some embodiments of the invention, a keyboard detects press or release of keys using one or more ranging techniques. Targets are attached to keys of the keyboard. As a key is pressed or released, the target is moved into and/or out of the path of a distance measuring sensor. A range finder determines a distance from the sensor to the target and reports the distance to a microprocessor or other controller. Based on that distance data, the controller identifies the moved key. In at least some embodiments, the keys and controller are configured to determine the direction of key motion (i.e., up or down) and/or to detect simultaneous press or release of keys in a single row or column. In certain embodiments, a slider control is included. Yet other embodiments include an integral pointing device which tracks motion of a user's finger or other object using range detection. In some embodiments, certain targets have unique surface features. A key coupled to one of those targets can be identified based on the target's surface features. The invention is not limited to keyboards, and embodiments include other types of input devices in which a user may manipulate buttons, levers, switches or other types of control pieces, and where movement of such control pieces is detected using one or more distance measuring techniques.

BRIEF DESCRIPTION OF THE DRAWINGS

The present invention is illustrated by way of example, and not by way of limitation, in the figures of the accompanying drawings and in which like reference numerals refer to similar elements and in which:

FIGS. 8D-8E illustrate partial key masking.

FIGS. 14A-14D show additional embodiments of the invention in which the effects of key masking are avoided or reduced.

DETAILED DESCRIPTION OF THE INVENTION

Figure 1:
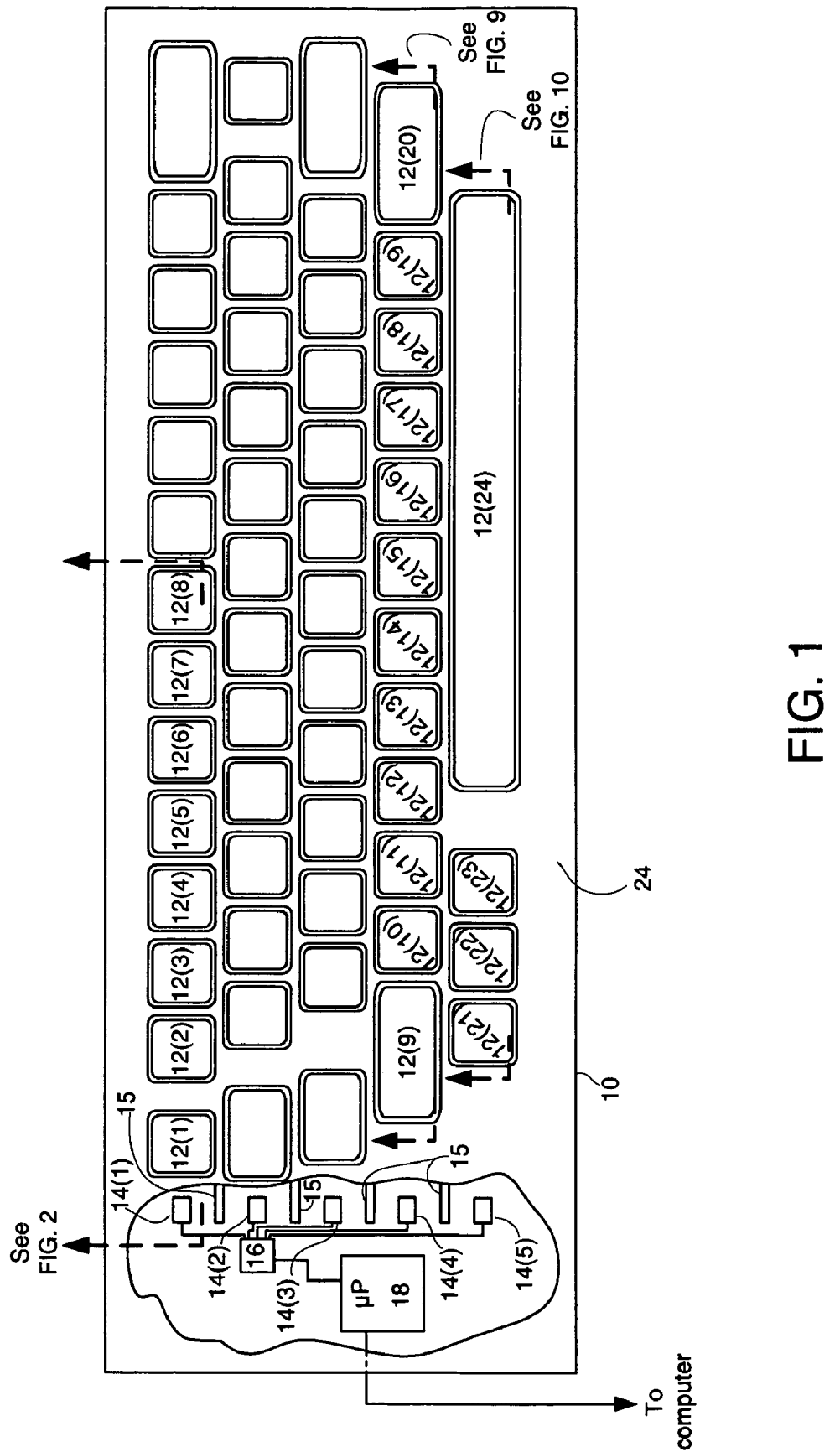
FIG. 1 is a diagram of a keyboard according to at least some embodiments of the invention.

FIG. 1 is a diagram of a keyboard 10 according to at least some embodiments of the invention. Although keyboard 10 is shown with a collection of keys arrayed in a manner similar to that of a common office keyboard, the invention is not limited by the type, number or arrangement of keys or other user controls. For ease of reference, but so as to avoid unnecessary detail, a portion of the keys shown in FIG. 1 are numbered 12(1)-12(24). The keys of keyboard 10 are attached to portions (not shown in FIG. 1 but shown in FIG. 2) extending through an upper case 24. Shown in a partial cutaway at the side of keyboard 10 are five laser range detection sensors 14(1)-14(5) positioned at the far end of each row of keys. Separating each key row is a baffle 15. Baffle 15 prevents light reflected from a key in one row from reaching a sensor corresponding to another row. Each of sensors 14(1)-14(5) includes a laser diode and associated range sensing module.

Each of sensors 14(1)-14(5) is electrically coupled to detection circuitry 16. As described below in more detail, detection circuitry 16 contains circuitry for calculating ranges between a sensor and a target attached to the bottom of a depressed key. As also described below, various methods of range detection can be utilized in connection with the invention. Although the chosen method of range detection will affect the specific configuration of sensors 14(1)-14(5) and detection circuitry 16, such configuration(s) appropriate for a given range detection methodology will be apparent to persons skilled in the art in light of the description provided herein. Distance data output by detection circuitry 16 is received by controller 18. Although controller 18 is shown as (and will subsequently be referred to as) a microprocessor, controller 18 could alternatively include state machine circuitry or other suitable components capable of controlling operation of keyboard 10 as described herein. Microprocessor 18 determines, based on distance data from detection circuitry 16, which keys have been pressed or released. Microprocessor 18 then reports key presses and releases to a computer or other device receiving keyboard output. Key presses and releases can be reported to a computer or other device using any of various methods known in the art. For example, the press or release of a key could be transmitted using a Human Interface Device (HID) report generated in compliance with the Device Class Definition for Human Input Devices, the Universal Serial Bus (USB) Specification, the USB HID Usage Tables, Human Interface Device Profile v.1.0, and other related documents available from the USB Implementers Forum, Inc.

Figure 2:
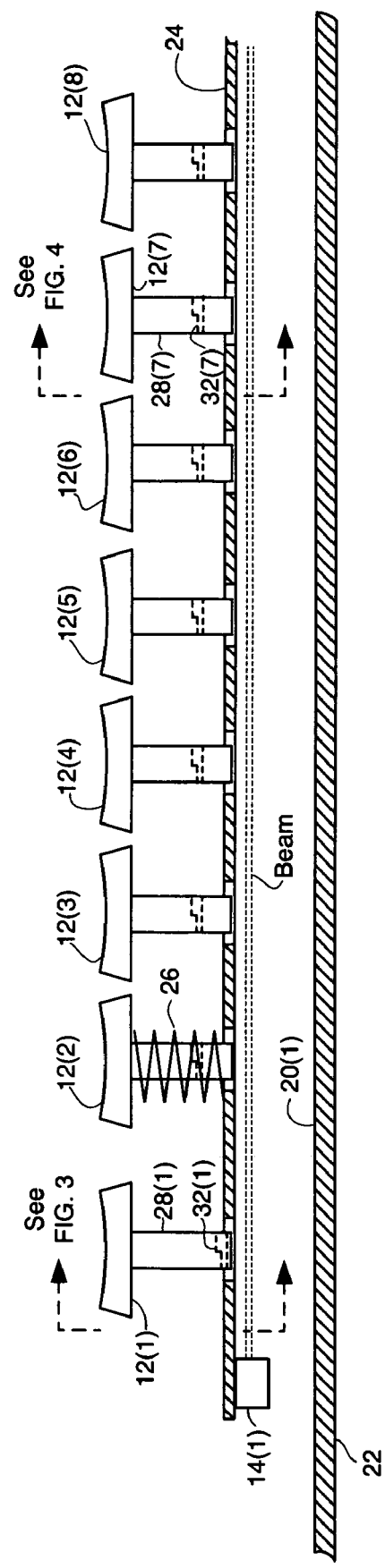
FIG. 2 is an enlarged partial sectional view of the keyboard of FIG. 1.

FIG. 2 is an enlarged partial sectional view of keyboard 10 taken along the location indicated in FIG. 1. For convenience, FIG. 2 only shows a portion of the keys in a key row. However, the remaining keys of the row are similar to keys 12(2)-12(8). Except for the number, shape and layout of keys, or as otherwise described below, the other rows of keyboard 10 are similar to the row partially shown in FIG. 2. As seen in FIG. 2, sensor 14(1) is positioned such that a beam of laser energy emanating from sensor 14(1) projects into a cavity 20(1) between upper case 24 and lower case 22. Coupled to the bottom of each key is a plunger. As used herein, "coupled" includes two components that are attached (movably or fixedly) by one or more intermediate components. So as not to unduly obscure the drawing, reference numbers (28(1) and 28(7)) are only assigned to the plungers for keys 12(1) and 12(7). As a key is pressed, its corresponding plunger protrudes through a hole in upper case 24 and into cavity 20(1). Each key in the row is biased upward from upper case 24 by a spring 26. So as not to obscure FIG. 2, a spring 26 is only shown for key 12(2). Although FIG. 2 shows a coil spring as the biasing mechanism, other mechanisms could be used. For example, a key could be biased upward by a rubber dome having a base in contact with upper case 24 and an upper portion attached to the underside of a key. When downward force is exerted on a key in such an embodiment, the dome collapses as the key is pressed. When force is removed from the key, the dome forces the key upward.

Figure 3:
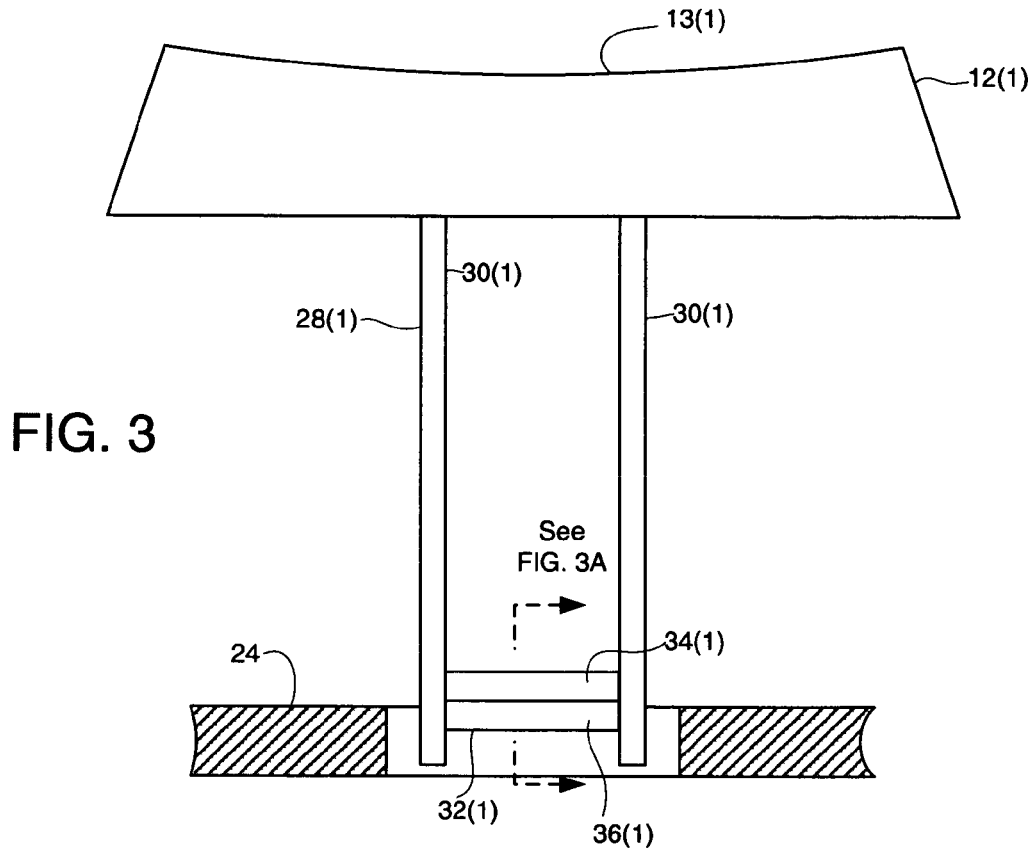
FIG. 3 is an enlarged partial sectional view of a key from the keyboard of FIGS. 1 and 2.
Figure 3A:
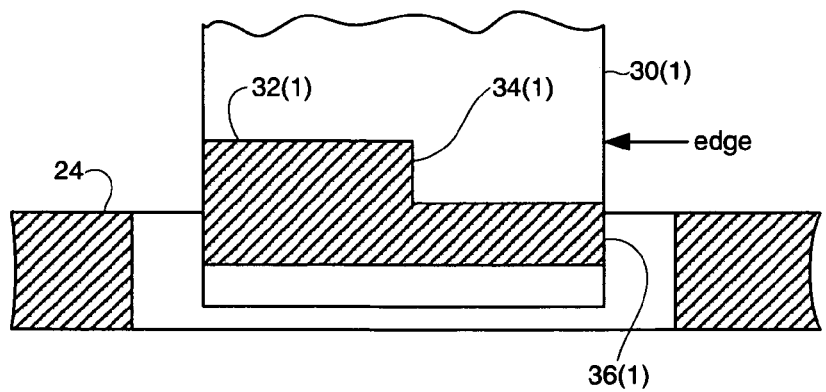
FIG. 3A is an enlarged partial sectional view of the key of FIG. 3.

FIG. 3 is an enlarged partial sectional view of keyboard 10 taken along the location indicated in FIG. 2. FIG. 3 shows a side view of key 12(1) oriented 90° from the view of FIG. 2. For simplicity, a biasing spring is not shown in FIG. 3. Attached to the underside of key 12(1) opposite from face 13(1) and extending generally perpendicular to face 13(1) is plunger 28(1) having a pair of side brackets 30(1) and a reflective target 32(1). Target 32(1) has a lower face 36(1) and an upper face 34(1). As seen in FIG. 3A, lower face 36(1) is closer to one set of edges of brackets 30(1) (labeled "edge"), while upper face 34(1) is recessed from those edges. In this manner, one of the faces is closer to sensor 14(1) than the other face. Although FIGS. 3 and 3A show an open space between target 32(1) and the underside of key 12(1), plunger 28(1) could alternately be formed from a transparent piece of plastic or other material and have a target embedded within (or attached to the bottom of) the plastic or other material. As discussed below, an open space or transparent material permits light to pass between target 32(1) and the underside of key 12(1).

Figure 4:
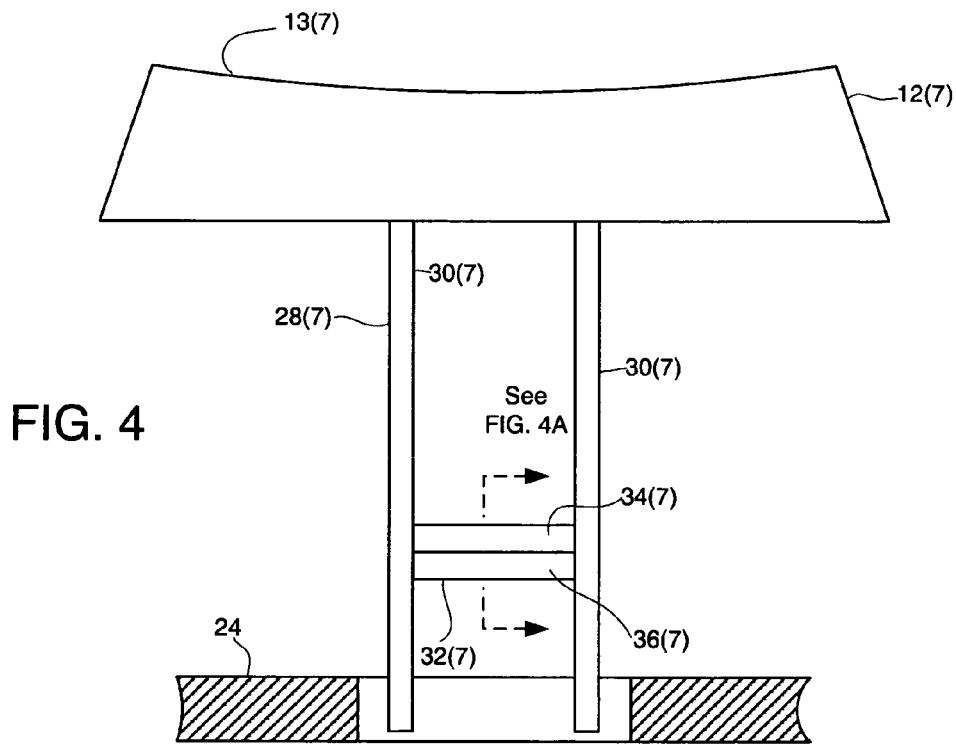
FIG. 4 is an enlarged partial sectional view of another key from the keyboard of FIGS. 1 and 2.
Figure 4A:
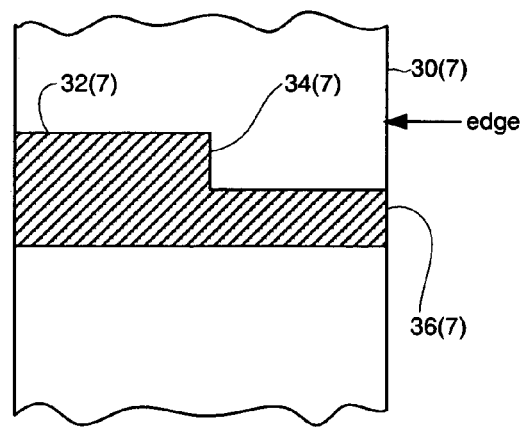
FIG. 4A is an enlarged partial sectional view of the key of FIG. 4.

FIG. 4 is an enlarged partial sectional view of keyboard 10 taken along the location indicated in FIG. 2. FIG. 4 shows a side view of key 12(7) oriented 90° from the view of FIG. 2. Key 12(7) also has a plunger 28(7) attached to its underside opposite from face 13(7) and extending generally perpendicular to face 13(7), with plunger 28(7) having a pair of side brackets 30(7) and a reflective target 32(7). Target 32(7) similarly has a lower face 36(7) and an upper face 34(7). As seen in FIG. 4A, lower face 36(7) is closer to one set of edges of brackets 30(7) (labeled "edge"), while upper face 34(7) is recessed from those edges. As seen by comparing FIGS. 3 and 4, target 32(1) is positioned lower within plunger 28(1) than is target 32(7) within plunger 28(7). As shown with broken lines in FIG. 2, each of the plungers for keys 12(2)-12(8) in the row of FIG. 2 has a target at approximately the same height. The remaining keys in the row also have plungers that include targets at approximately the same height as the targets for keys 12(2)-12(8).

Figure 5A:
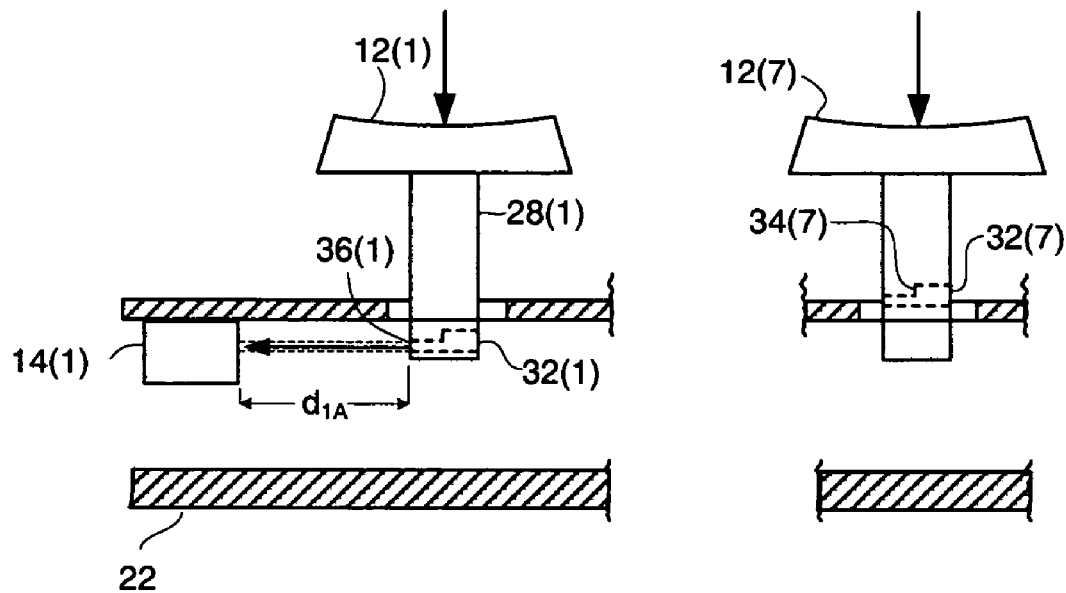
FIGS. 5A-6B illustrate detection of a key press according to at least some embodiments of the invention.
Figure 5B:
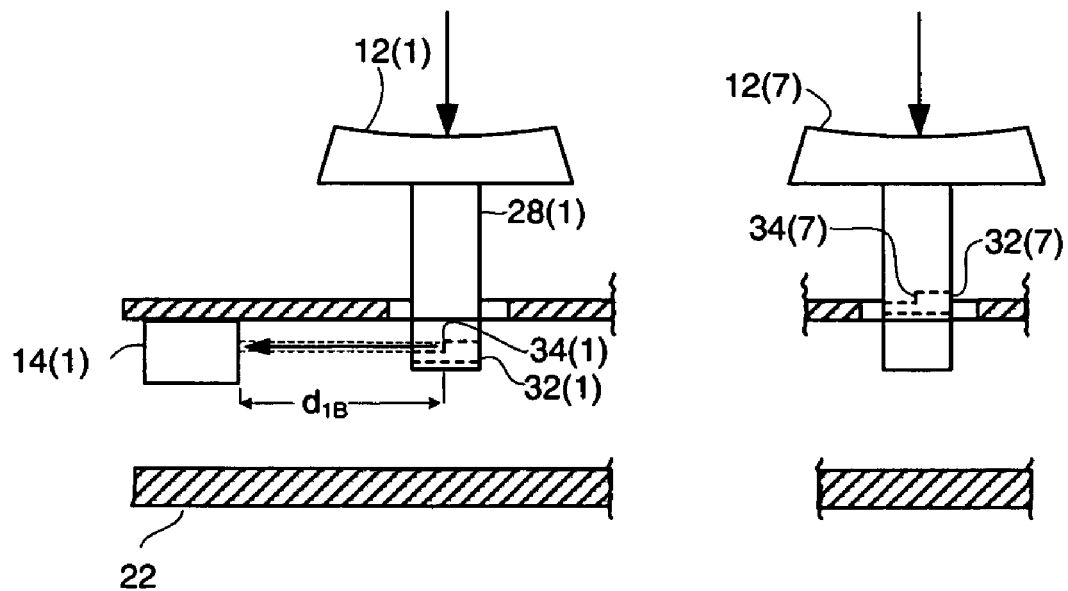

FIGS. 5A-6B illustrate detection of a key press according to at least some embodiments of the invention. FIGS. 5A-6B are sectional views of keyboard 10 similar to FIG. 2, but with keys 12(2)-12(6) and 12(8) removed for simplification. In FIG. 5A, keys 12(1) and 12(7) are pressed simultaneously. Because the relative position of target 32(1) within plunger 28(1) is lower than the relative position of target 32(7) within plunger 28(7), target 32(1) first moves across the beam of laser energy (shown as dashed lines) emanating from sensor 14(1). As lower face 36(1) of target 32(1) passes through the beam, laser energy reflects from face 36(1) and returns to sensor 14(1) (shown as an arrow within the dashed beam lines). As a result, and in a manner described in more detail below, a distance $d_{1.4}$ between sensor 14(1) and face 36(1) is determined. As the pressing of keys 12(1) and 12(7) continues, lower portion 36(1) passes through the beam and upper portion 34(1) enters the beam (see FIG. 5B). At this point, laser energy reflects from upper face 34(1) and back to sensor 14(1). A distance $d_{1B}$ between sensor 14(1) and upper face 34(1) is then determined. Because the distances between sensor 14(1) and each of the upper and lower target faces are fixed and known for every key in the row, the distance measurements $d_{1A}$ and $d_{1B}$ can be used to identify the key being pressed. Based on the order of the distance measurements (i.e., $d_{1A}$ before $d_{1B}$), the direction of key movement (down) is also known. A reverse order ($d_{1B}$ before $d_{1A}$) would indicate the key is being released and is traveling upwards.

Figure 6A:
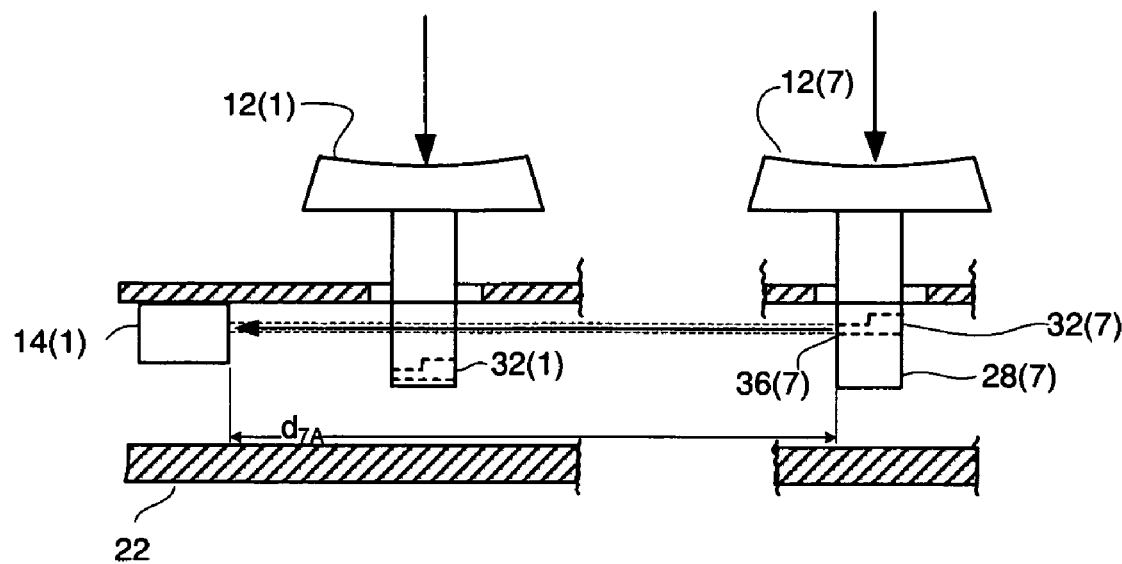
Figure 6B:
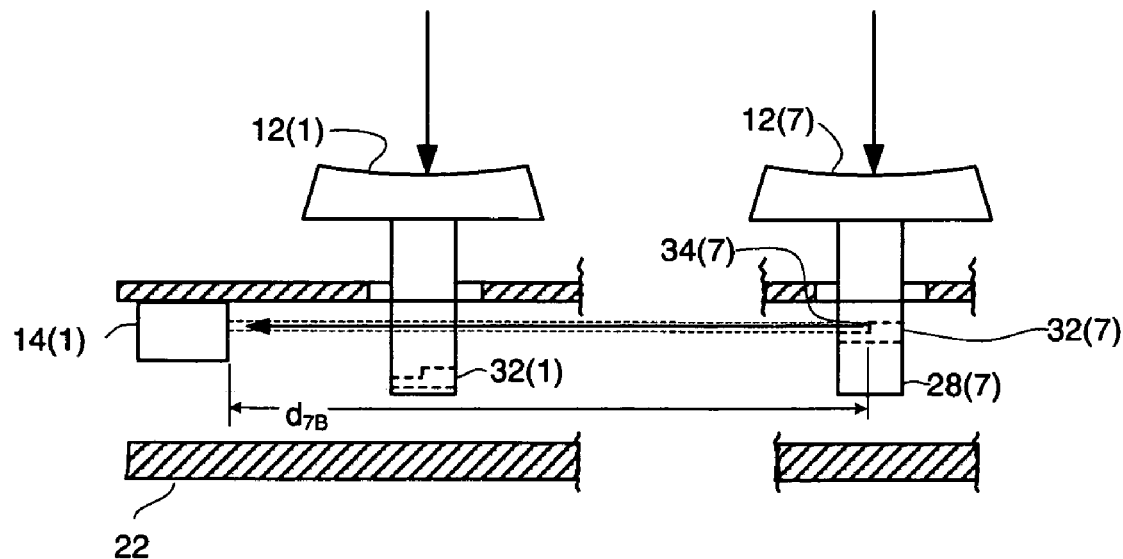

In FIG. 6A keys 12(1) and 12(7) have continued to travel downward, and target 32(1) has passed completely through the beam. Because the beam from sensor 14(1) is able to pass through the space between target 32(1) and the underside of key 12(1), the beam can now reflect from target 32(7). As seen in FIG. 6A, a distance $d_{7A}$ is first determined as the beam reflects from lower face 36(7). As seen in FIG. 6B, a distance $d_{7B}$ is determined as the beam reflects from upper face 34(7). With this information, and based on known distances between sensor 14(1) and the upper and lower target faces for each key in the row, the key 12(7) is identified and its direction of movement determined.

As shown in FIGS. 5A-6B, different relative positions of targets within their respective plungers permit detection of simultaneous pressing of two keys. For example, key 12(1) could be an ALT, CTRL or SHIFT key, with key 12(7) being a key for a number or letter. As can be appreciated from FIGS. 5A-6B, the pressing of a single key could likewise be determined. The release of a key or key combination (and the corresponding upward movement of the corresponding targets) would be determined in a similar manner, but in reverse order. In other words, as pressure is released from a key, the spring or other biasing mechanism will push the key upward and withdraw the plunger from the cavity (e.g., cavity 20(1) in FIG. 2). As the plunger moves upward through the beam, the upward movement is determined based on the order in which the upper and lower faces of a target pass through the beam.

As a target crosses a sensor beam and distance data is provided by detection circuitry 16 (FIG. 1) to microprocessor 18, microprocessor 18 identifies the moving key and its direction of motion. In at least some embodiments, microprocessor 18 identifies a key using a lookup table matching a key code to a value of distance between a sensor and the upper (and/or lower) face of a corresponding target. Microprocessor 18 then stores data indicating the key's condition (up or down) and reports a change in condition (pressed or released) to a computer or other device receiving keyboard output.

Figure 7A:
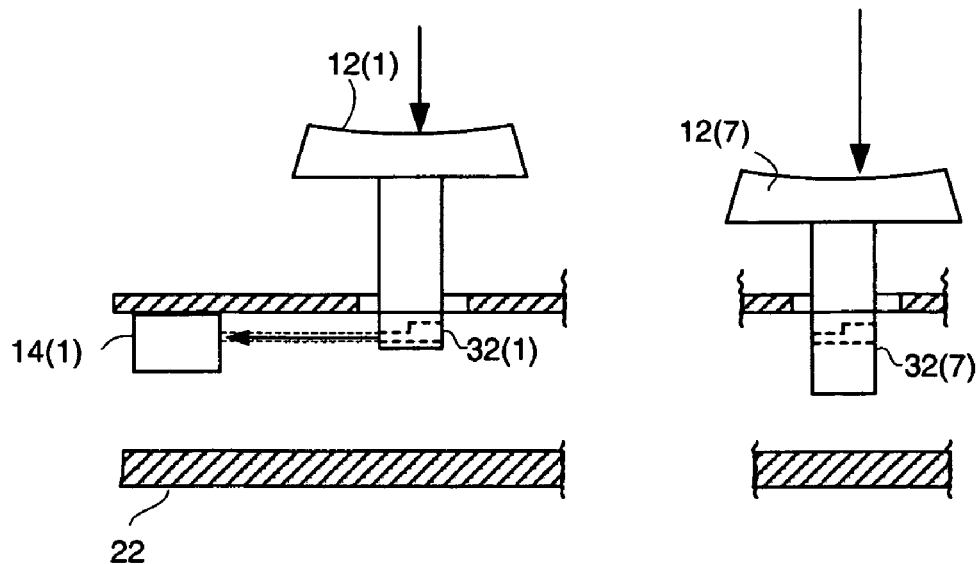
FIGS. 7A and 7B illustrate masking of one key by another.
Figure 7B:
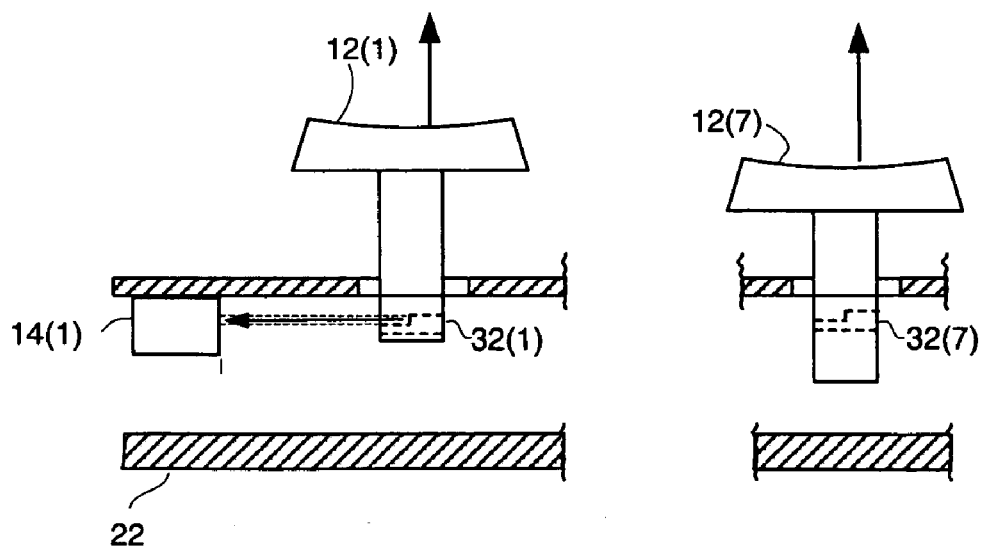

The astute observer will note with regard to the embodiment of FIGS. 2-6 that it is possible for one key to mask the press (or release) of another key under certain circumstances. As shown in FIG. 7A, key 12(7) is pressed down faster than key 12(1). If the speed and timing of the two key presses is such that target 32(1) blocks the beam while target 32(7) passes through the region where an unobstructed beam would shine, sensor 14(1) will not register the pressing of key 12(7). Similarly, and as shown in FIG. 7B, key 12(7) could be released faster than key 12(1). If the speed and timing of the two key releases is such that target 32(1) blocks the beam while target 32(7) passes through the region where the beam would ordinarily shine, sensor 14(1) will not register the release of key 12(7). If either of these conditions occurs, unwanted effects could result. If the pressing of key 12(7) is not detected (FIG. 7A), a subsequent HID report indicating a release of key 12(7) could cause anomalous effects within a computer or other device receiving the HID report. If the release of key 12(7) is not detected (FIG. 7B), microprocessor 18 would continue to note the key as being pressed and not report the key release to a computer or other device.

Figure 8:
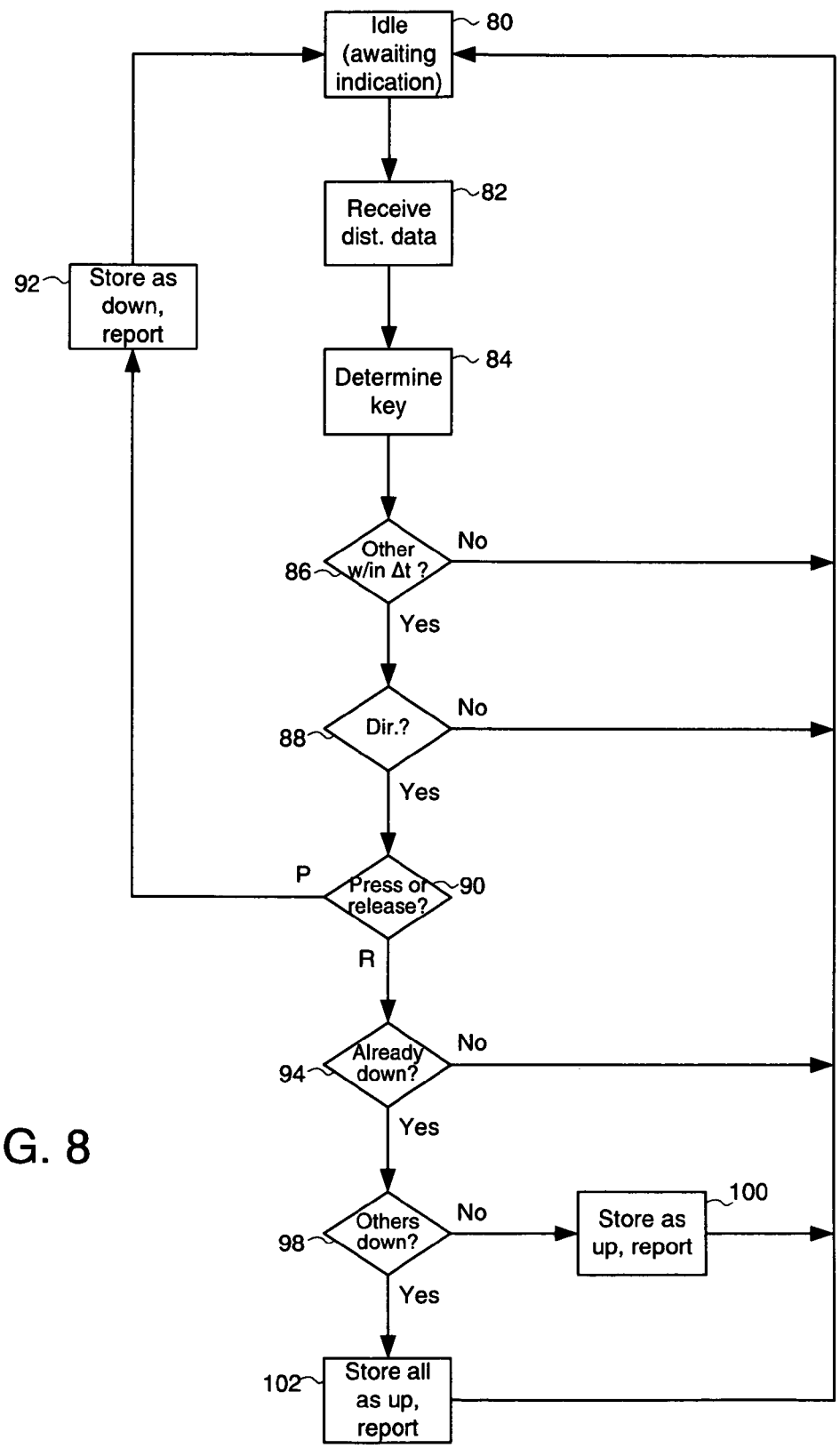
FIG. 8 is a flow chart showing operation of a microprocessor according to at least some embodiments of the invention.

In at least some embodiments, microprocessor 18 is programmed to avoid potential problems caused by such masking. If a key press is masked, the user will in all likelihood notice the non-registration of a key press (e.g., the resulting image on a computer display will not be as the user intended). When this occurs, the user will know to retry the key combination. If the release of that masked key is later detected, microprocessor 18 will simply ignore it. When two simultaneously pressed keys are released, microprocessor 18 may be further configured to treat both keys as released, even if only one key release has been detected. FIG. 8 is a flow chart showing operation of processor 18 according to at least some embodiments. At block 80, microprocessor 18 is idle and awaiting distance measurement data from detection circuitry 16 (FIG. 1) indicating that a key has been pressed or released. When a key is pressed or released, the appropriate one of sensors 14(1)-14(5) generates a signal as a target for that key moves through the sensor's beam. The sensor transmits that signal to detection circuitry 16, which determines the distance from the sensor to a face of a moving key's target. The detection circuitry forwards this information to microprocessor 18, which receives the information at block 82. Microprocessor 18 proceeds to block 84, and using the received distance information, identifies the key being pressed or released.

Figure 8A:
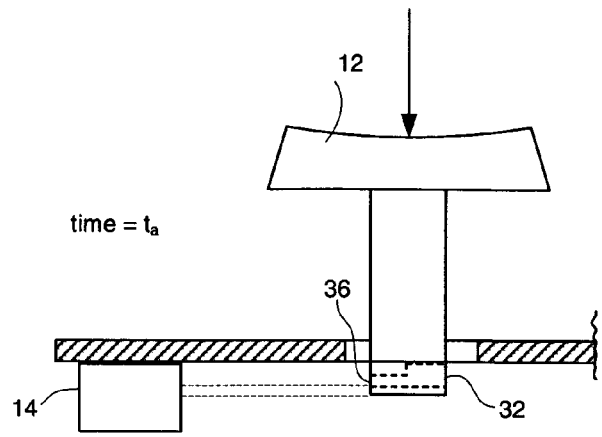
FIGS. 8A-8C illustrate a target passing through a sensor beam.
Figure 8B:
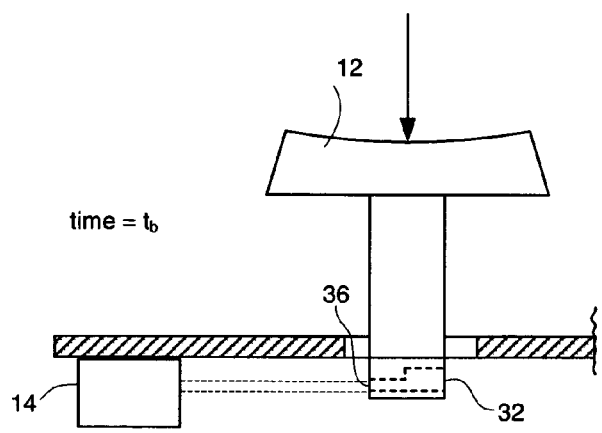
Figure 8C:
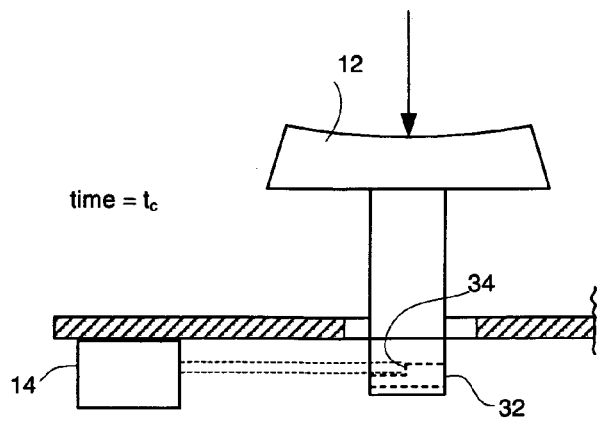

At block 86, microprocessor 18 determines if it has received another distance indication for the same key within a time period Δt (e.g., 500 milliseconds). If not, the target for that key may have just begun passing through the sensor's beam. This is shown in FIG. 8A, where key 12 is being pressed. As the lower face 36 of target 32 initially enters the path of the beam from a sensor 14, the first distance measurement is made at time $t_a$. Although this one measurement could be used to identify key 12, it would not be enough to determine whether key 12 is moving up or down. In FIG. 8B, target 32 has continued through the beam when another measurement is made at time $t_b$. However, the measurement in FIG. 8B would still only correspond to lower face 36, and direction of key motion could not be determined. It is not until time $t_c$ (FIG. 8C), when the distance to upper face 34 is measured, that key direction can be determined. Most key presses (and releases) occur relatively rapidly, even if a key might be held down for a relatively long time after a press. By comparing the time of a key press for which an indication is received (block 82) with the time for any previous indications regarding the same key, microprocessor 18 avoids confusing data for earlier presses or releases of the same key with the current data. Accordingly, when microprocessor 18 receives a distance measurement at time $t_a$ (FIG. 8A) for a key for which it has not received other distance measurements for a sufficiently long period (Δt), microprocessor 18 proceeds on the "No" branch from block 86 to block 80 to await another distance measurement. When the measurement at time $t_b$ (FIG. 8B) is received, and assuming $t_a$–$t_b$ is less than Δt, microprocessor 18 proceeds to block 88 in FIG. 8. However, because a direction can not yet be determined, microprocessor returns to block 80 on the "No" branch from block 88. After the distance measurement at time $t_c$ is received (FIG. 8C), and assuming $t_b$–$t_c$ is less than Δt, microprocessor 18 will then be able to determine a direction of key movement at block 88 and proceed on the "Yes" branch to block 90.

The algorithm shown in blocks 86 and 88 also permits microprocessor 18 to treat a partial masking of a key as a complete masking. One example of this is illustrated in FIGS.

8D and 8E. In FIGS. 8D and 8E, two keys 12(a) and 12(b) are being pressed simultaneously. Target 32(a) blocks the beam from sensor 14 at time $t_d$ (FIG. 8D). However, a small part of upper face 34(b) of target 32(b) is exposed at time $t_e$ after target 32(a) completes it traversal of the beam (FIG. 8E). At this point, a distance measurement is taken of upper face 34(b). Because a direction for the movement of key 12(b) is not determinable from this one measurement, microprocessor 18 never progresses on the "Yes" branch from block 88 (FIG. 8) for this press of key 12(b).

If microprocessor 18 reaches block 90, it may then proceed on one of two alternate branches. If the identified key is being pressed, microprocessor 18 proceeds on the "P" branch to block 92. At block 92, microprocessor 18 stores data for the key in a down condition and reports the change in key condition (a key press) to a computer or other device. Microprocessor 18 then returns to block 80.

If the key previously identified at block 84 has been released, microprocessor 18 proceeds on the "R" branch from block 90 to block 94. At block 94, microprocessor 18 checks its stored data regarding status of all keys, and determines if there is stored data indicating that the key identified in block 84 is down. If not, the pressing of the key was masked, and microprocessor 18 ignores the key release and returns to block 80 via the "No" branch. If microprocessor 18 determines at block 94 that the released key is noted as down, microprocessor 18 proceeds on the "Yes" branch from block 94 to block 98. At block 98, microprocessor checks stored data to determine if other keys maskable by the released key are also down. If not, microprocessor 18 proceeds on the "No" branch from block 98 to block 100. At block 100, microprocessor treats only the released key as up, stores an indication that the key is now up, and reports the key release to the computer or other device receiving the keyboard output. In this manner, a user is able to keep another key on the same row as the released key pressed and make other key press combinations. For example, key 12(1) (see FIG. 2) could be a SHIFT key, and keys 12(2) through 12(8) could correspond to letters. The user could thereby keep key 12(1) pressed and sequentially press any of keys 12(2) through 12(8) to type upper case characters.

If at block 98 microprocessor 18 determines that there are other down keys which could be masked by the released key, microprocessor 18 proceeds on the "Yes" branch to block 102. At block 102, microprocessor 18 treats the released key and all maskable keys as released, stores data indicating those keys are released, and reports the key releases to the computer or other device receiving keyboard output. From block 102, microprocessor 18 proceeds to block 80 to await receipt of another indication of a key press or release.

As previously indicated, FIG. 2 shows one key in a key row having a target height within a plunger different from the heights of the targets within the plungers of other keys in the row. Stated differently, the height of one key's target is offset relative to the heights of the other keys' targets. In such an embodiment, the simultaneous pressing of key 12(1) and only one of the remaining keys in the row can be detected. In general, this is not a problem. In particular, most intended simultaneous key presses are combinations of a key such as SHIFT, ALT or CTRL with a character key or a function key (e.g., F1, F2, etc.). Intended simultaneous pressing of other combinations of keys within the same row is relatively rare, and could be handled in various manners. For example, a special key in another row could be assigned a function facilitating unusual key combinations. The special key could be pressed in conjunction with the first key of an unusual combination, which could signal microprocessor 18 that an unusual combination of the first key and another key is coming. The user could then release the first key (and the special key, if desired) and press the second key of the combination. Microprocessor 18 would then treat the first and second keys as pressed until the second key is released.

Figure 9:
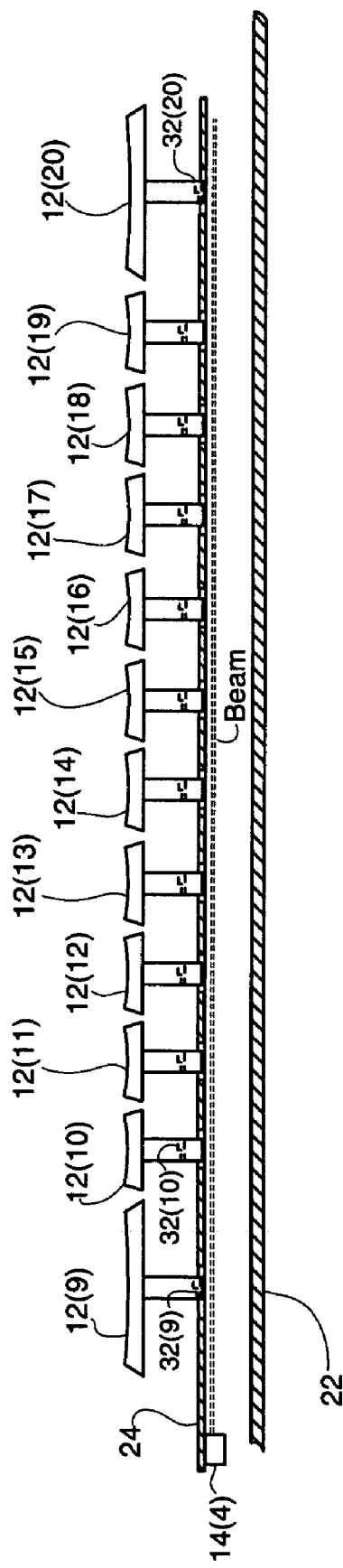
FIGS. 9-12 show additional configurations of key targets according to various embodiments of the invention.
Figure 10:
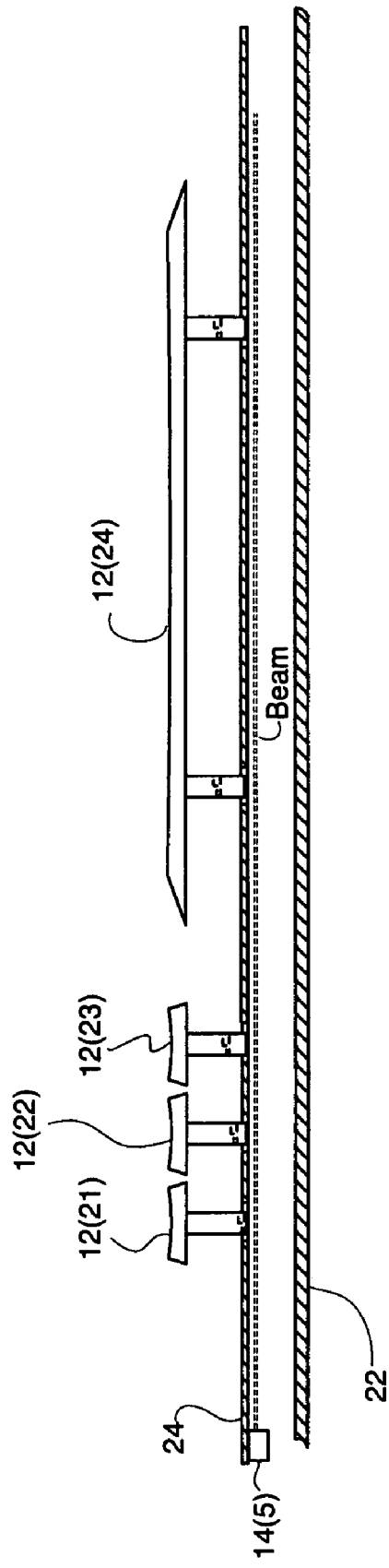
Figure 11:
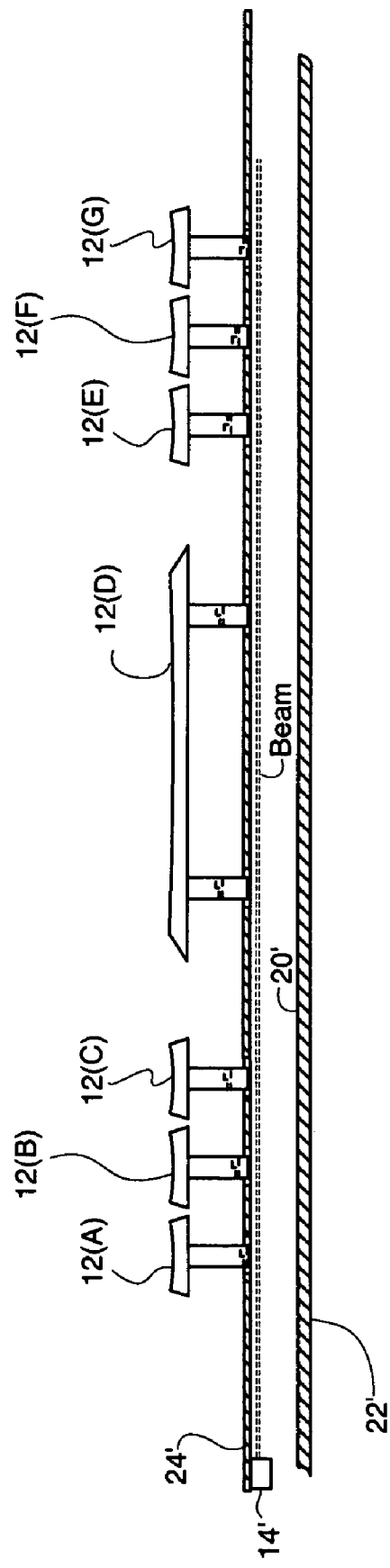
Figure 12:
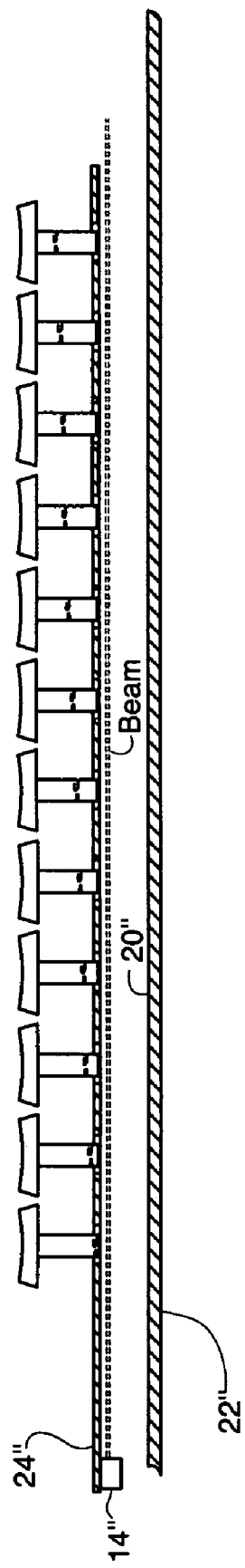

In other embodiments, there are other distributions of target heights for keys within a single key row. As shown in FIG. 9, for example, a sectional view taken along the location shown in FIG. 1, keys 12(9) and 12(20) at the ends of the row have targets 32(9) and 32(20) at one height, while keys 12(10)-12(19) have targets (e.g., target 32(10)) at another height. This configuration could correspond, for example, to a pair of SHIFT keys located at opposite ends of a row of keys. In this configuration, simultaneous pressing of key 12(9) and any of keys 12(10) through 12(19), or of key 12(20) and any of keys 12(10) through 12(19), could be detected. FIG. 10, a sectional view taken along the location shown in FIG. 1, shows another configuration. In the configuration of FIG. 10, simultaneous pressing of any combination of keys 12(21) through 12(24) could be detected. FIG. 11, which does not correspond to a row in the keyboard of FIG. 1, shows yet another configuration for a row of keys. Also shown in FIG. 11 are a sensor 14' (similar to sensors 14(1)-14(5) in other figures), upper case 24' (similar to upper case 24), lower case 22' (similar to lower case 22) and a cavity 20' (similar to cavity 20(1)). In the configuration of FIG. 11, simultaneous pressing can be detected of any combination of one of keys 12(A) and 12(G), one of keys 12(B) and 12(F), one of keys 12(C) and 12(E), and key 12(D). FIG. 12 shows a configuration in which each key in a row has a target at a different height. In the configuration of FIG. 12, a simultaneous pressing of any combination of keys within the row can be detected. Also shown in FIG. 12 are a sensor 14" (similar to sensors 14(1)-14(5) in other figures), upper case 24" (similar to upper case 24), lower case 22" (similar to lower case 22) and a cavity 20" (similar to cavity 20(1)).

Figure 13:
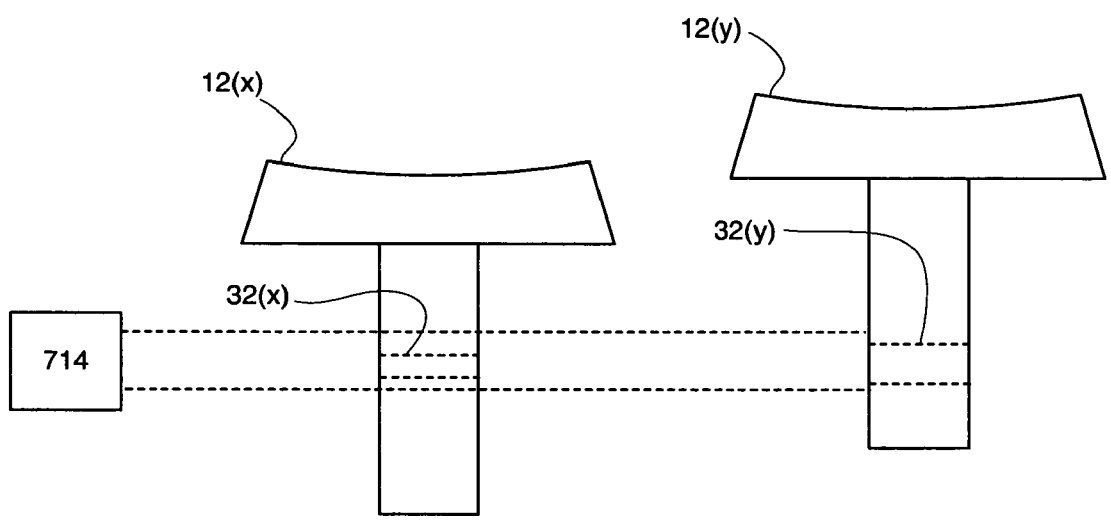
FIG. 13 illustrates avoidance of key masking according to certain embodiments of the invention.

In some embodiments, masking is avoided by using targets that are smaller in height (or other appropriate dimensional measurement) than the light emitted by a sensor. As shown in FIG. 13, target 32(y) of key 12(y) has a larger height than target 32(x) of key 12(x), but both target heights are smaller than the height of the beam from sensor 714. Because of this relative sizing, target 32(x) does not mask target 32(y). By appropriately modifying the detection circuitry (not shown in FIG. 13), simultaneous reflections from targets 32(x) and 32(y) can be identified using the self-mixing or triangulation range finding techniques. The self-mixing technique is discussed below in connection with FIG. 26. The triangulation technique is discussed below in connection with FIG. 27.

Figure 14A:
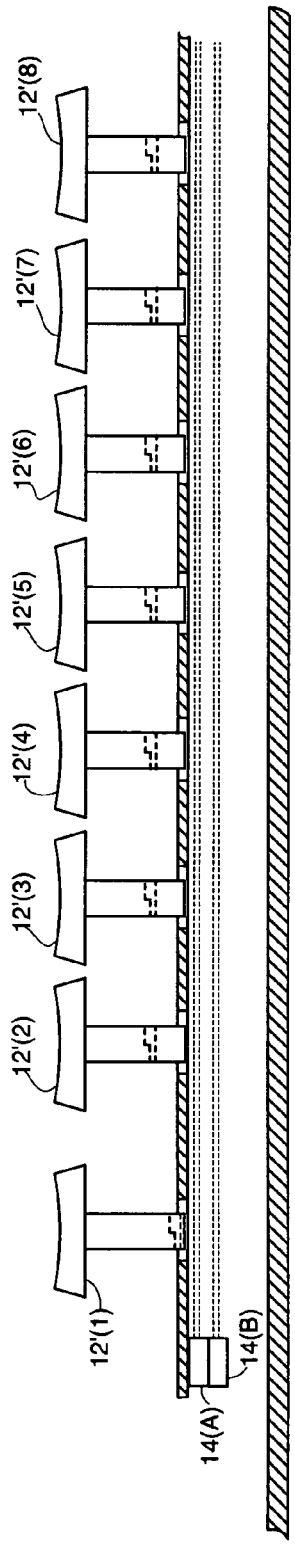
Figure 14B:
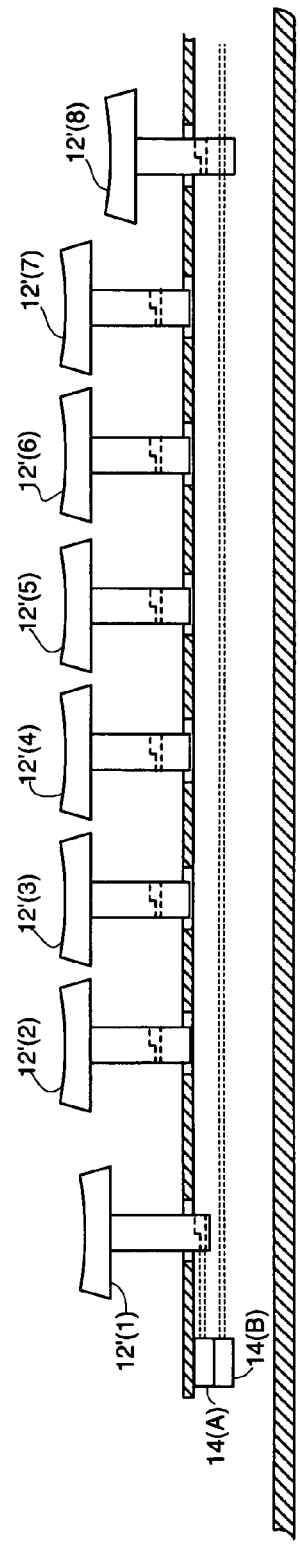

FIGS. 14A-14D show several additional manners in which key masking can be reduced or avoided. FIGS. 14A-14C show a row similar to that of FIG. 2, and including keys 12'(1)-12'(8). In this embodiment, however, two sensors 14(A) and 14(B) transmit parallel beams of laser energy with the cavity under keys 12'(1)-12'(8). As seen in FIG. 14B, a key such as key 12'(1) could mask another key (such as key 12'(8)) in one of the beams. However, and as shown in FIG. 14C, the second beam is able to detect key 12'(8). To overcome this configuration and still mask one of the keys during a key combination, the user would have operate the masking key (key 12'(1) in the present example) in a very erratic manner (e.g., partially pressing the key to place its target within the first beam, holding the key at that partial press while the target of the other key traverses the first beam location, and then quickly partially pressing the first key a little further and holding its target in the second beam). As can be appreciated, this would be a highly unusual occurrence, and could also be addressed by using an algorithm such as in FIG. 8.

FIG. 14D shows a variation on the embodiment of FIGS. 14A-14C. In FIG. 14D, sensors 214(A) and 214(B) (which are similar to sensors 14(A) and 14(B) of FIGS. 14A-14C) are on opposite ends of the row. In this embodiment, key 212(1) cannot mask any of keys 212(2)-212(8). As also shown in FIG. 14D, a target in this embodiment can be modified such that it also includes offset faces reflecting the beam from sensor 214(B).

Figure 15A:
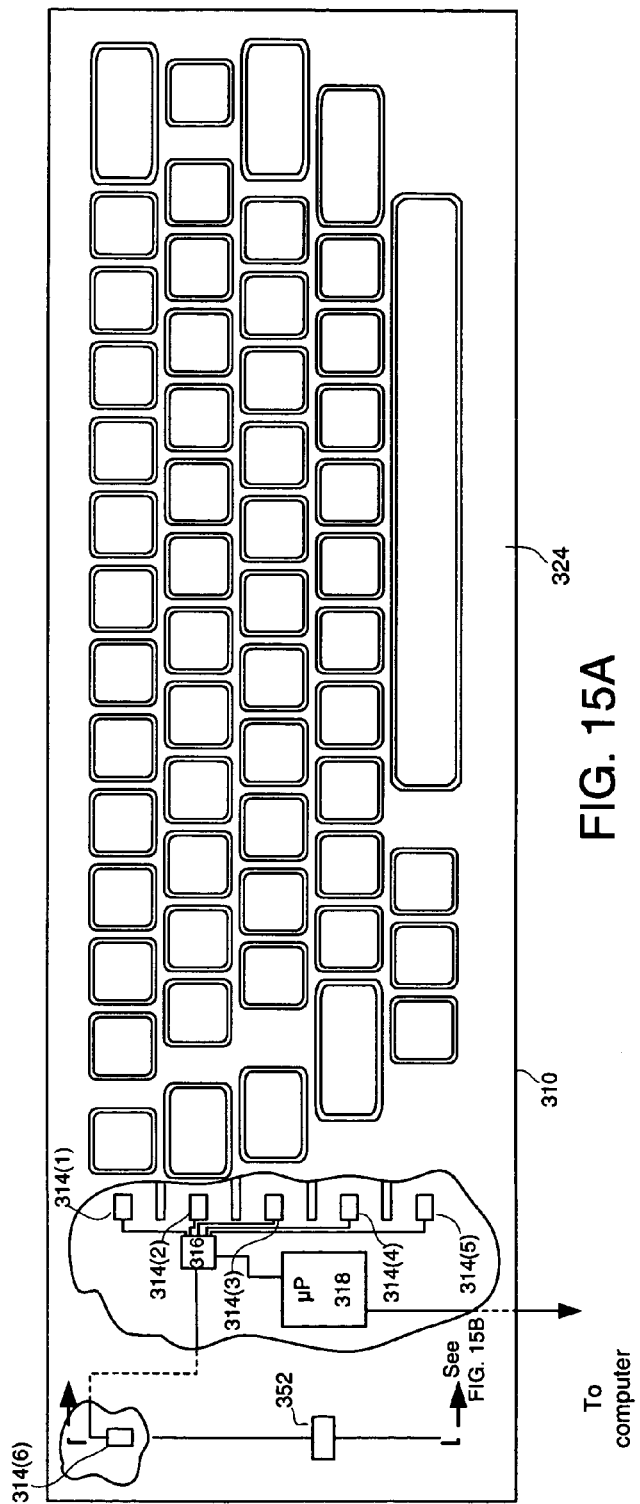
FIGS. 15A-15D show embodiments of a keyboard having a slider control.
Figure 15B:
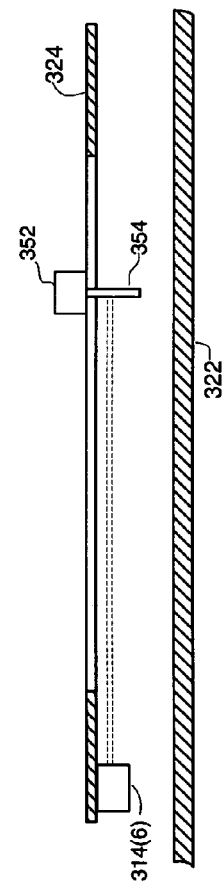
Figure 15C:
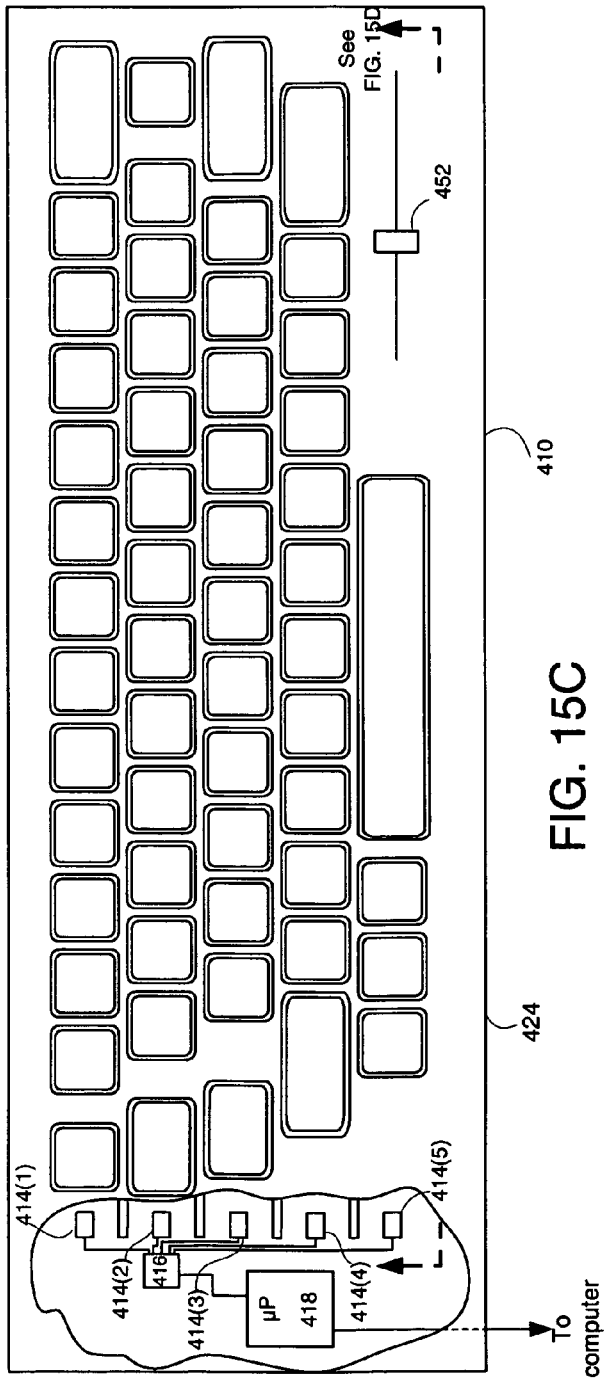
Figure 15D:
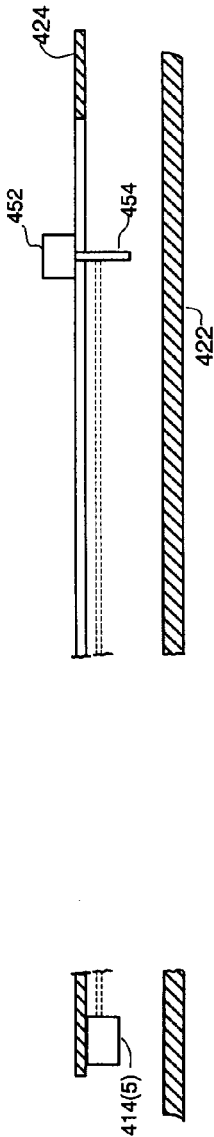

FIGS. 15A and 15B show a keyboard 310 according to at least one additional embodiment. A component in the embodiment of FIGS. 15A and 15B that is similar to a component the embodiment of FIGS. 1 and 2 will have the same reference number from FIG. 1 and/or FIG. 2, but incremented by 300 (e.g., microprocessor 18 in FIG. 1, microprocessor 318 in FIG. 15A). Keyboard 310 includes a slider control 352. Slider control 352 can be used to provide input for applications receiving a range (i.e., more than two) of values (e.g., a volume control for a media player, an intensity control for a display screen, etc.). As shown in FIG. 15B, a sectional view taken along the location shown in FIG. 15A, slider 352 includes an attached target 354 in the path of a laser beam emanating from a sensor 314(6) (which sensor is similar to one or more of sensor 314(1)-314(5)). Moving slider control 352 forward or backward causes the distance between sensor 314(6) and target 354 to change. Various values for that distance are mapped to various values for the quantity being controlled (e.g., volume levels); as a new distance is detected, it is reported to microprocessor 318 by detection circuitry 316. Microprocessor 318 then converts the distance into the appropriate value for transmission to a computer or other device. In at least some embodiments, and as shown in FIGS. 15C and 15D, sensor 414(5) detects key presses and is also used to detect movement of slider 452. The remaining components in FIGS. 15C and 15D are similar to components in FIGS. 1 and 2, but have reference numbers offset by 400 (e.g., microprocessor 18 in FIG. 1 vs. microprocessor 418 in FIG. 15C).

Figure 16A:
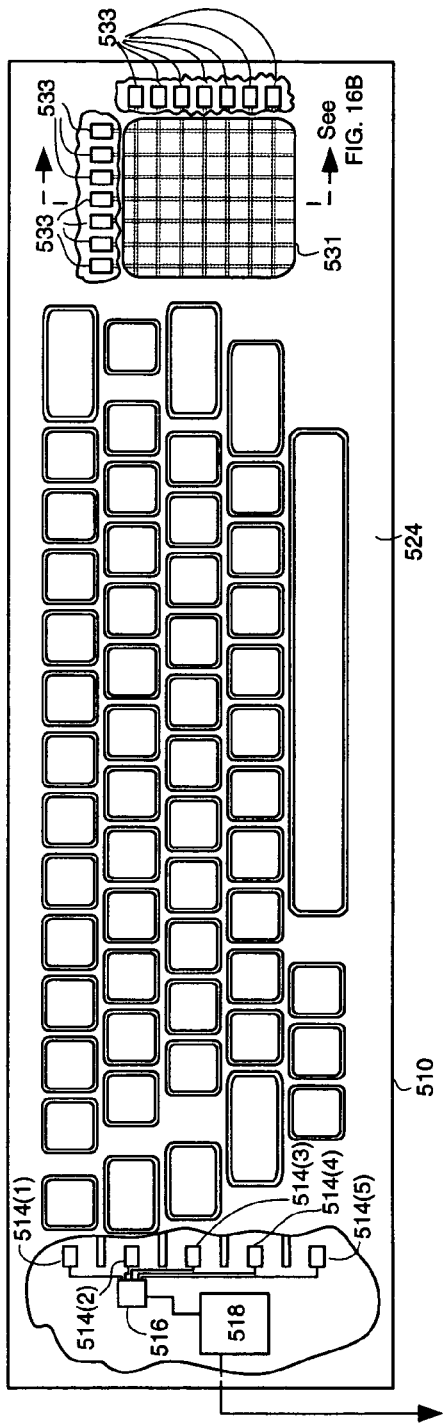
FIGS. 16A-16C show embodiments of a keyboard having a built-in pointing device.
Figure 16B:
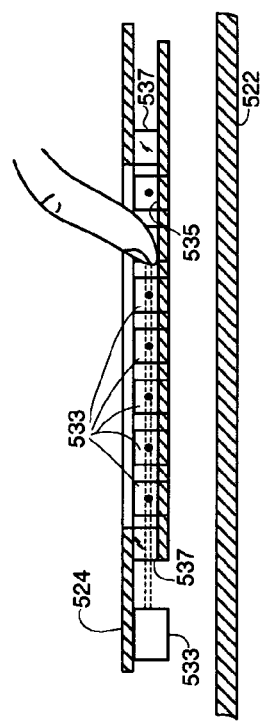

FIGS. 16A and 16B show a keyboard 510 according to additional embodiments of the invention. A component in the embodiment of FIGS. 16A and 16B that is similar to a component the embodiment of FIGS. 1 and 2 will have the same reference number from FIG. 1 and/or FIG. 2, but incremented by 500 (e.g., microprocessor 18 in FIG. 1, microprocessor 518 in FIG. 16A). Keyboard 510 includes a region 531 having a built-in pointing device. Distributed along at least two edges of region 531 are a series of sensors 533. Each sensor 533 transmits a beam of laser energy across region 531.

Figure 16C:
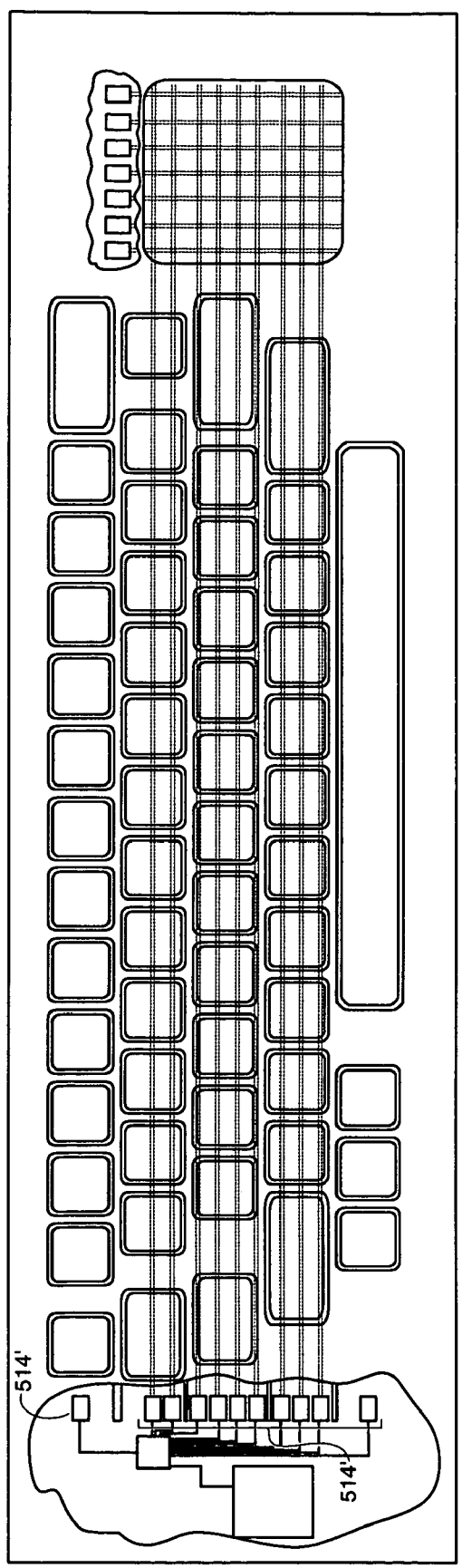

FIG. 16B is a sectional view taken along the location shown in FIG. 16A, and shows a user's finger in contact with a surface 535 of region 531. Surface 535 is offset from upper case 524 by a transparent plastic rim 537. Rim 537 allows laser energy from sensors 533 to pass through. As a user places his or her finger on surface 535, and as shown in FIG. 16B, one or more of the sensors 533 on two edges of region 531 detect the distance of the user's finger from those edges. Using these distances, the position of the user's finger on surface 535 can be determined. Sensors 533 are electrically coupled to detection circuitry 516, which communicates distance information to microprocessor 518. Microprocessor 518 then transmits to a computer or other device pointing device data generated from the distance information. This pointing device data may include relative position changes similar to output from a mouse, trackball, touchpad, etc. In at least one alternate embodiment shown in FIG. 16C, sensors 514' used to detect key presses are also used to detect a distance of a user's finger from an edge of the pointing device surface.

Figure 17A:
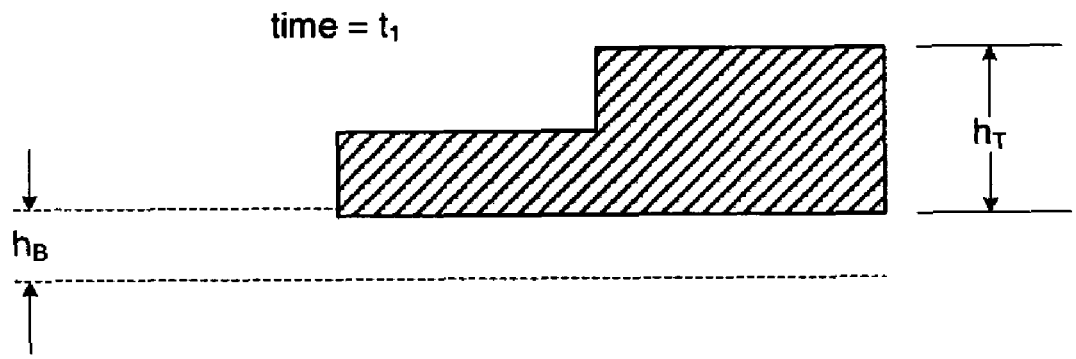
FIGS. 17A and 17B illustrate calculation of key press velocity according to at least some embodiments of the invention.
Figure 17B:
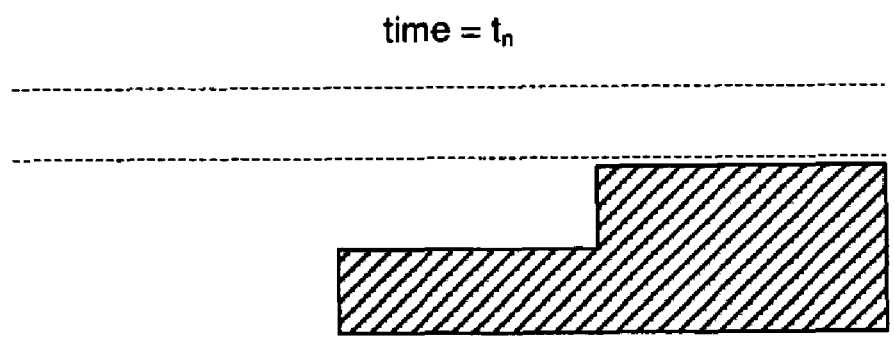
Figure 18:
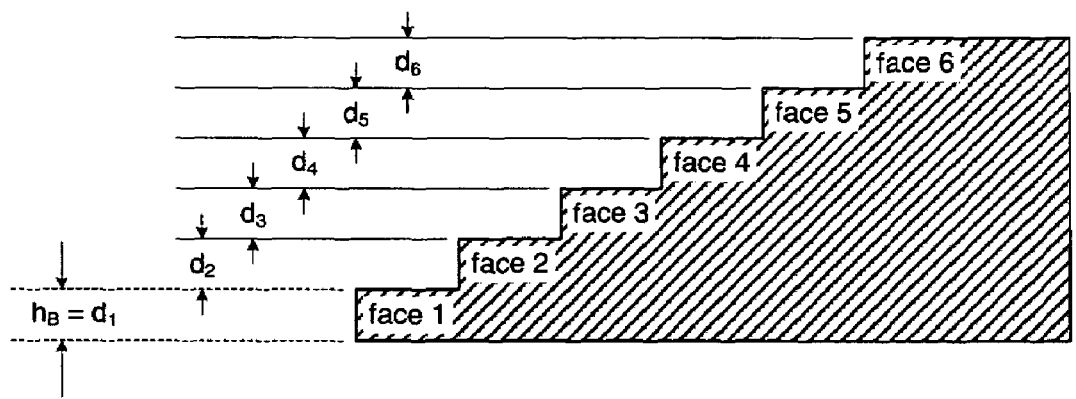
FIG. 18 is a cross-sectional view of a target shape, according to at least some embodiments, for determining velocity and acceleration of a key press.

In at least some embodiments, both the direction and speed and/or acceleration of a target's movement through a sensor beam are determined. This information can be used, e.g., for estimation of force exerted on a key, thereby allowing a user to use a key for more than simple up/down input. For example, a user could press harder to obtain a faster key repeat rate. For embodiments having a two-faced target such as in FIGS. 2-6B, speed of a key press can be approximated in various manners. One such manner is shown in FIGS. 17A and 17B. In FIGS. 17A and 17B, it is assumed that the speed of the key press remains fairly constant, that the height of the target ($h_T$) is approximately twice the beam height ($h_B$), and that the frequency of the distance calculation is high relative to the speed with which the target traverses the beam (i.e., distance is calculated numerous times for a single traversal). As shown in FIG. 17A, the target first enters the beam at time=$t_1$. As shown in FIG. 17B, the target leaves the beam at time $t_n$ (i.e., at time $t_n$ the sensor is no longer receiving an indication that any portion of the target is reflecting the beam). The speed of the target moving through the beam can thus be approximated as $(h_T+h_B)/(t_n-t_1)$. In other embodiments, more accurate measurements of the speed and/or acceleration of a key can be obtained by using targets having additional faces (FIG. 18). For example, velocity $v_1$ from a time $t_0$ when face 1 enters the beam until time $t_1$ when face 1 leaves the beam and face 2 enters the beam can be calculated as $(h_B+d_1)/(t_1-t_0)$. Similar speed velocity calculations $v_2$ through $v_6$ can be made for movement through the beam of faces 2 through 6 based on face heights $d_2$ through $d_6$ and the times at which each face enters and leaves the beam. Accelerations during target movement through the beam can be approximated by taking $\Delta v/\Delta t$, where $\Delta v$ is the difference between two velocity values and $\Delta t$ is the difference between the ending times used when calculating those velocities.

Figure 19A:
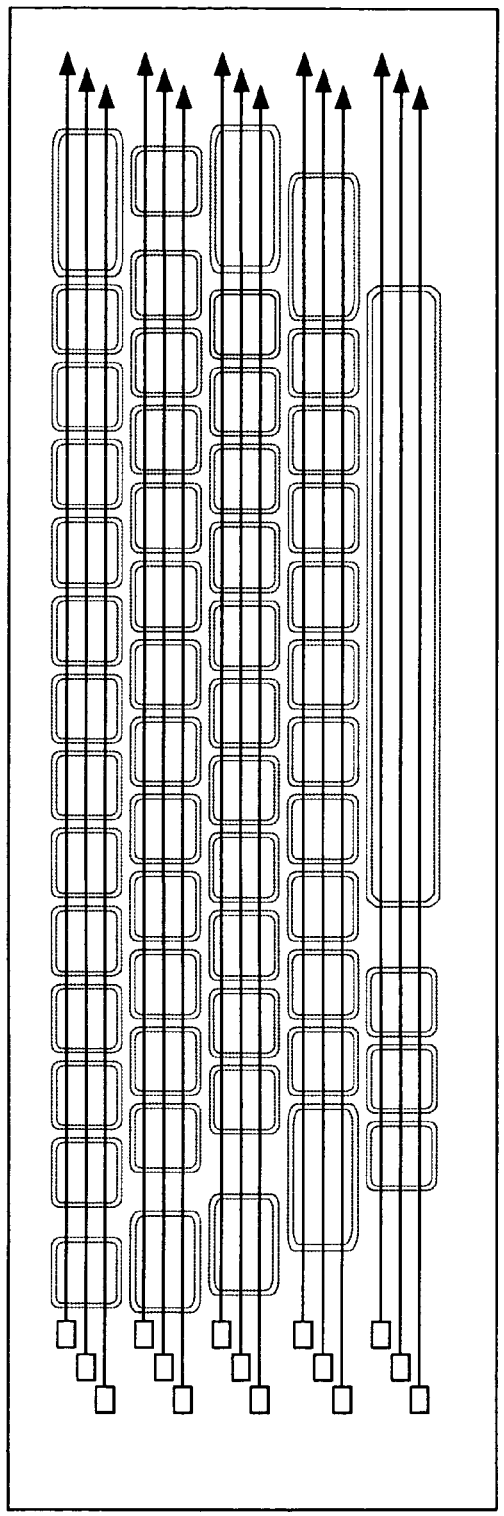
FIG. 19A shows arrangement of range finding sensors according to additional embodiments.
Figure 19B:
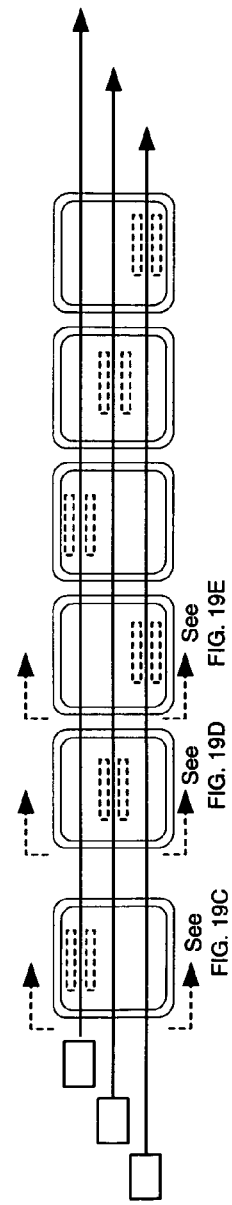
FIG. 19B-E shows arrangement of key targets according to additional embodiments.
Figure 19C:
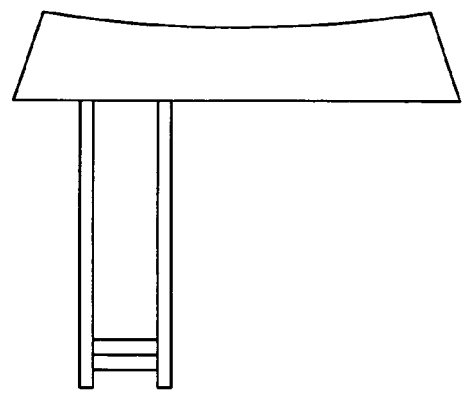
Figure 19D:
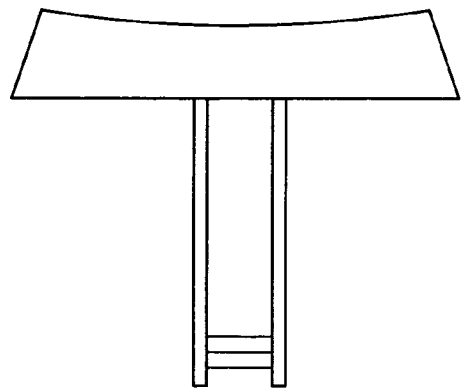
Figure 19E:
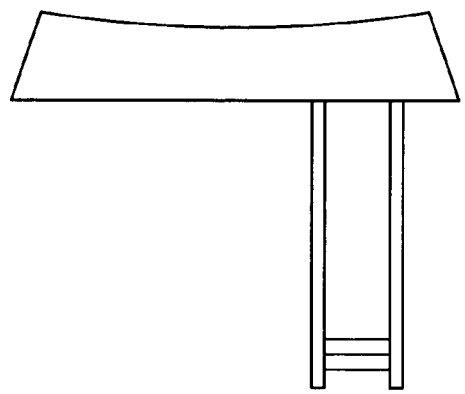
Figure 20:
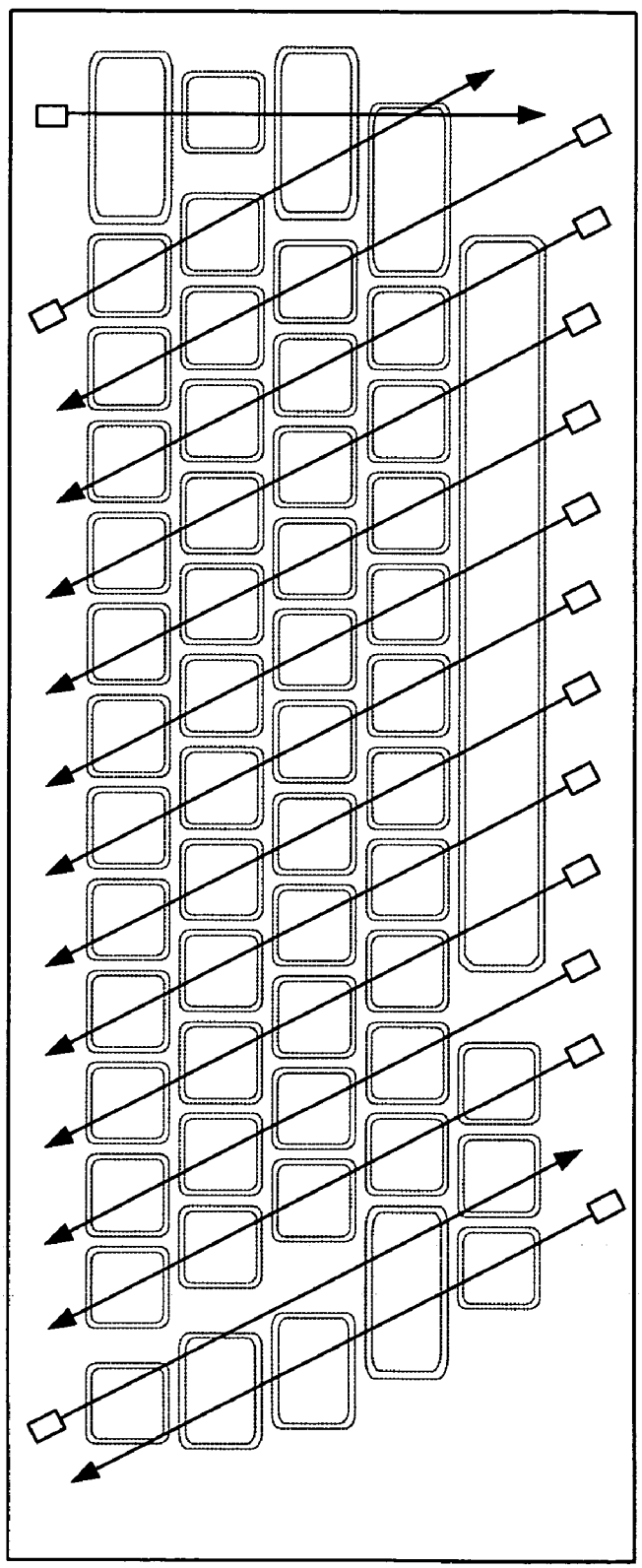
FIG. 20 shows arrangement of range finding sensors according to additional embodiments.

As previously indicated, some embodiments of the invention include two sensors for a row of keys. In still other embodiments, those sensors can be arranged side-by-side so as to further reduce the possibility of key masking. Additional sensors could also be included in a row. FIG. 19A shows three sensors per row. In such an embodiment, keys of a row can have targets which are laterally offset from one another, as shown in FIGS. 19B-E. In still other embodiments, and as shown in FIG. 20, sensors can be distributed along key columns. Each column could have one, two or more sensors, and could have sensors positioned at the top and/or bottom of the column.

Figure 21:
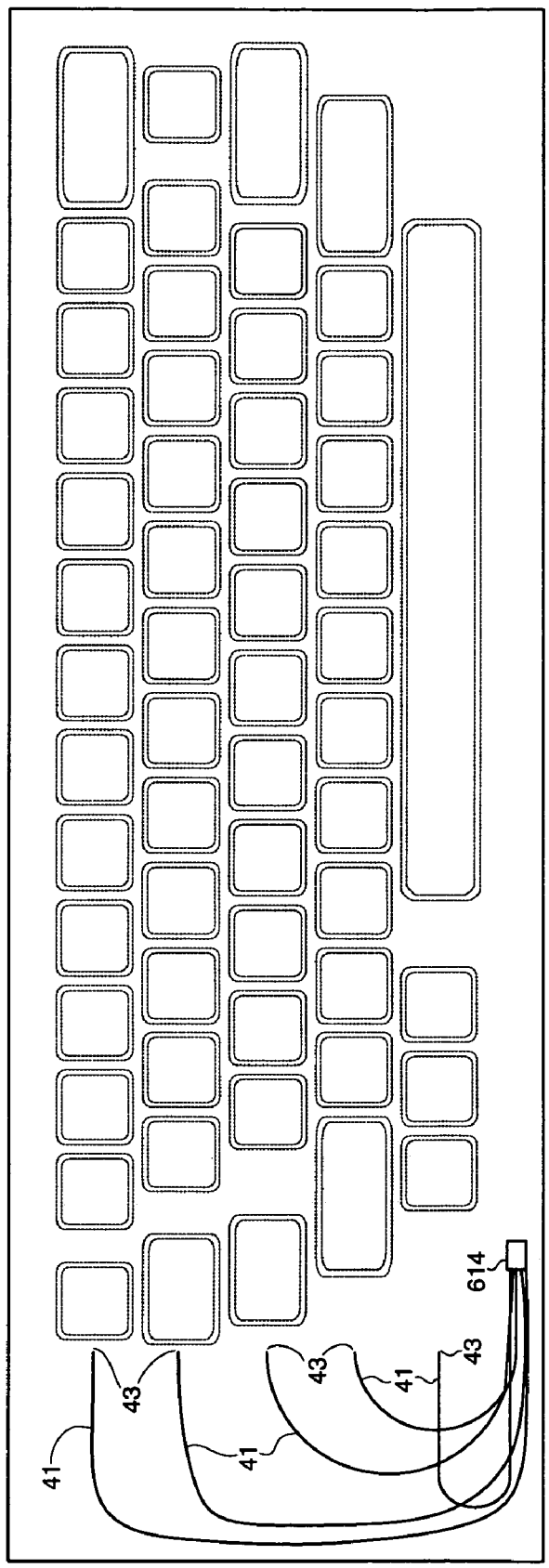
FIG. 21 shows a laser diode coupled to optical fibers, according to at least some embodiments, so as to form multiple range sensors.

In still other embodiments, a single laser diode can be used to implement multiple sensors. As shown in FIG. 21, a single laser diode 614 is optically coupled to a plurality of optical fibers 41. Laser energy emanates from the ends 43 of fibers 41. When a target is in the path of that energy, the beam is then reflected back into the fiber. By knowing which fiber received the reflection, the reflecting target can be identified. The determination of the receiving fiber can be performed in various manners. In at least some embodiments, each fiber is optically coupled to one or more digital micromirror devices acting as shutters for each fiber. These shutters open and close according to a known schedule, and the receiving fiber can be determined by reference to that schedule. In other embodiments, each fiber coupled to a laser diode is sized such that a known fiber length shift is added to the signal generated by the single laser diode 614. In effect, an additional "range" offset will be added for each fiber so that the particular fiber length plus the largest range corresponding to the keyboard will be smaller than the length of the fiber for the next row. By examining the magnitude of the measured "range" from the sensor, the fiber receiving a particular reflection can be identified and the actual range obtained by subtracting the corresponding fiber length. Notably, the range offset approach to identifying the fiber works with ranging techniques that measure distance based on path length for light travel (e.g., the phase-shift, FMCW and self-mixing techniques described below).

Figure 22A:
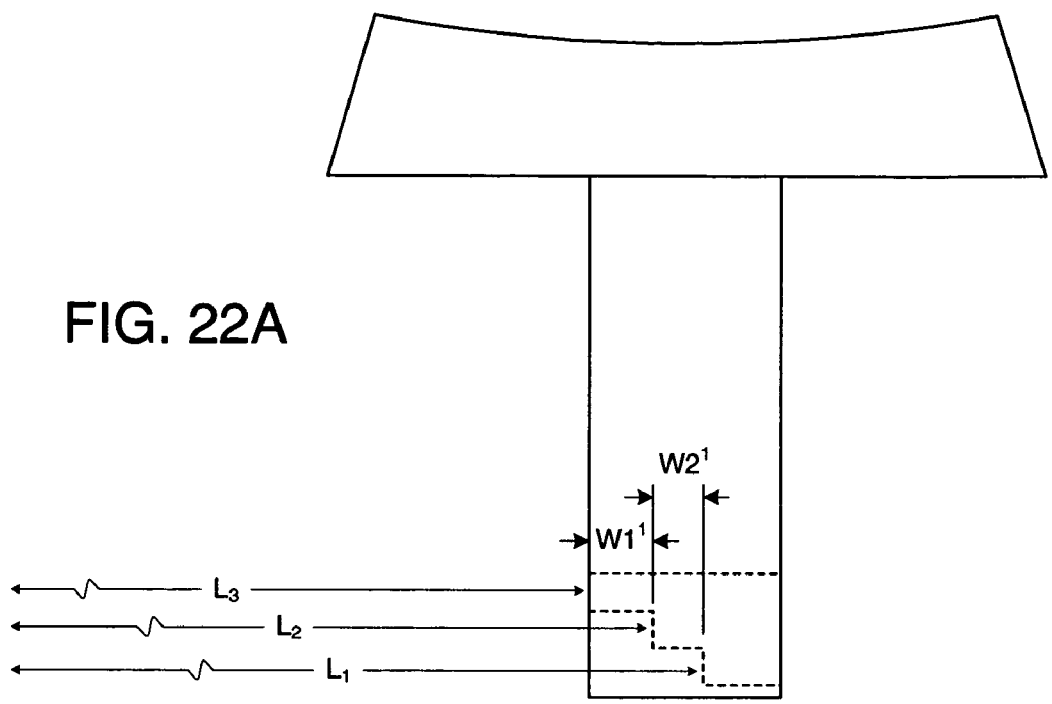
FIGS. 22A and 22B illustrate unique target surface features according to at least some embodiments.
Figure 22B:
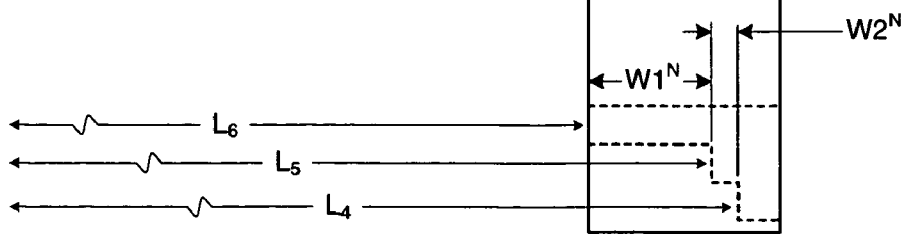

FIGS. 22A and 22B show yet another embodiment of the invention. In the embodiment of FIGS. 22A and 22B, at least some keys have a unique set of surface features. Based on those features, the identity of a key being pressed or released can be determined without knowing the position of the key in the keyboard. In this manner, a user can re-arrange the keys as desired (e.g., to change from a U.S. based "QWERTY" keyboard pattern to a pattern corresponding to another language). For example, when the target of the key in FIG. 22A first enters the sensor beam when being depressed, a reflection from the lowest face is received and a distance $L_1$ determined. As the key continues downward, a reflection from the next face is received and a distance $L_2$ determined. As the target continues across the beam a reflection from a third face is received and a distance $L_3$ is determined. Regardless of the key's location in the keyboard, $W1^1=L_2-L_3$ and $W2^1=L_1-L_2$. By referencing a lookup table containing values for these dimensions for each key, the pressed key can be identified. Similarly, the identification of the key in FIG. 22B can be determined from $W1^N=L_5-L_6$ and $W2^N=L_4-L_5$. In some embodiments, the target for each key of the keyboard has a unique shape. In other embodiments, only some of the keys can be repositioned, and thus only those keys need have a unique target shape. The remaining keys are in fixed (and known) locations and the presses or releases are determined based on the known locations.

As previously indicated, a variety of techniques can be utilized to determine range from a sensor to a target. Although each of the following ranging techniques is known per se, its application to a keyboard (or type of user input device having physically movable controls) as described herein is believed to be novel. Because these ranging techniques are generally known, only brief descriptions of several techniques are included.

Figure 23:
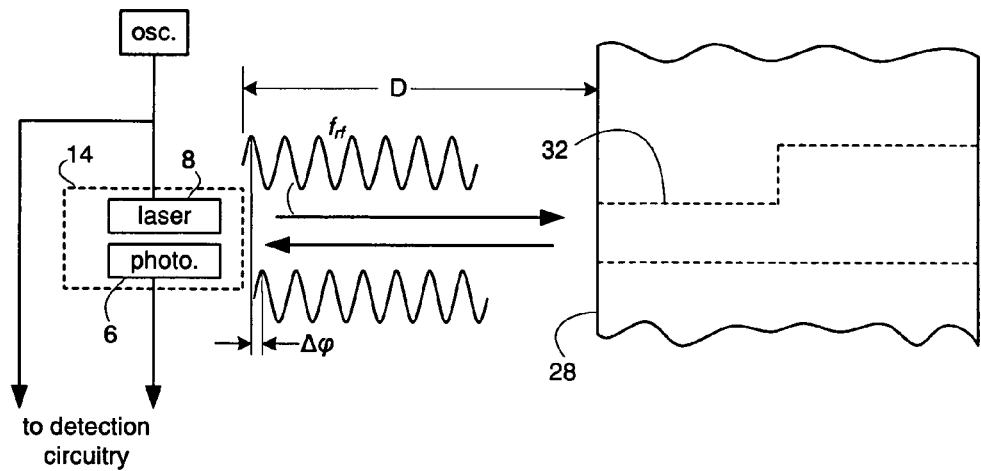
FIGS. 23-27 illustrate some of the range detection methodologies which can be utilized in connection with embodiments of the invention.

In at least some embodiments, one or more sensors 14 in a keyboard form part of a laser phase-shift range finder (FIG. 23). In such embodiments, the optical output of a laser diode 8 is modulated with a constant frequency. In particular, an oscillator generates a sine wave having a frequency $f_{rf}$, which is applied to the dc current biasing the laser diode and which is thereby impressed on the laser output. After reflection from a target 32 attached to a key plunger 28, a photodiode 6 collects a part of the reflected beam. Detection circuitry calculates a phase shift $\Delta\phi$ for the reflected beam. Because the phase shift $\Delta\phi=2\pi f_{rf}\Delta t$ (where $\Delta t$ is the time of flight of the reflected beam), the distance D between the laser diode and the target can be determined from Equation (1).

$$D = \frac{1}{2}C\frac{\Delta\varphi}{2\pi(f_{rf})} \qquad \text{Equation (1)}$$

In Equation (1), C is the speed of light in free space.

Figure 24:
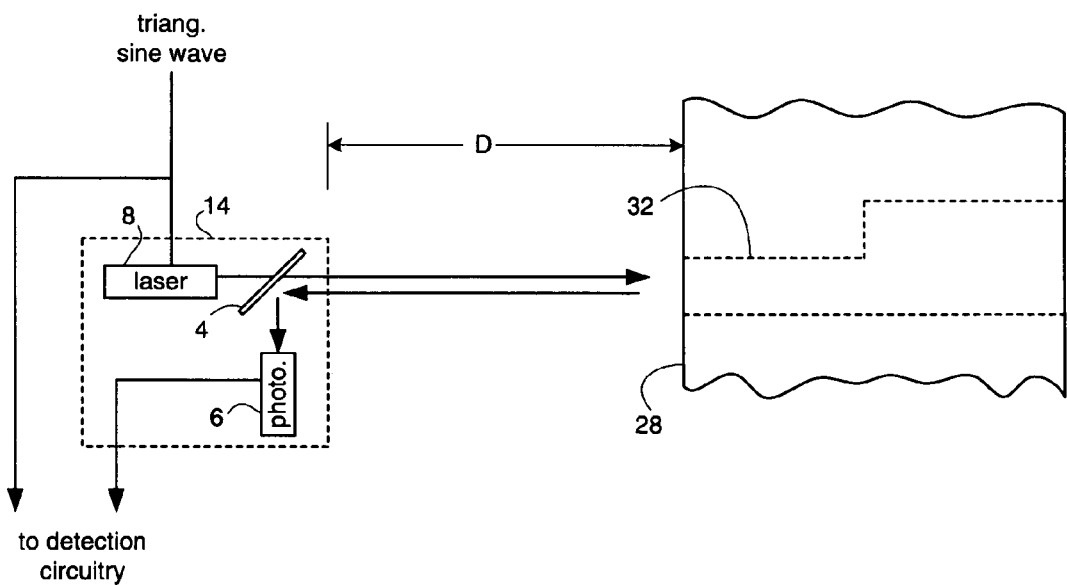

In at least some embodiments, one or more sensors 14 in a keyboard operate as part of a frequency modulated continuous wave (FMCW) range finder (FIG. 24). In such embodiments, a sensor 14 also includes a laser source (e.g., a laser diode 8) and a photodiode 6. The laser output is modulated by a triangular sine wave. Light reflected from a target will also be modulated according to a triangular sine wave, but will be shifted in frequency. The reflected light is partially reflected by a half-mirror 4, and a beat frequency (f) calculated (the absolute value of the difference between the modulated signal frequency in the emitted light and the modulated signal frequency in the reflected light). Using the beat frequency f, the distance D between the laser and the target 32 attached to a key plunger 28 is found using Equation (2).

$$f = \beta * \frac{2D}{C} \qquad \text{Equation (2)}$$

In Equation (2), β is the frequency modulation coefficient and C is the speed of light in free space.

Figure 25:
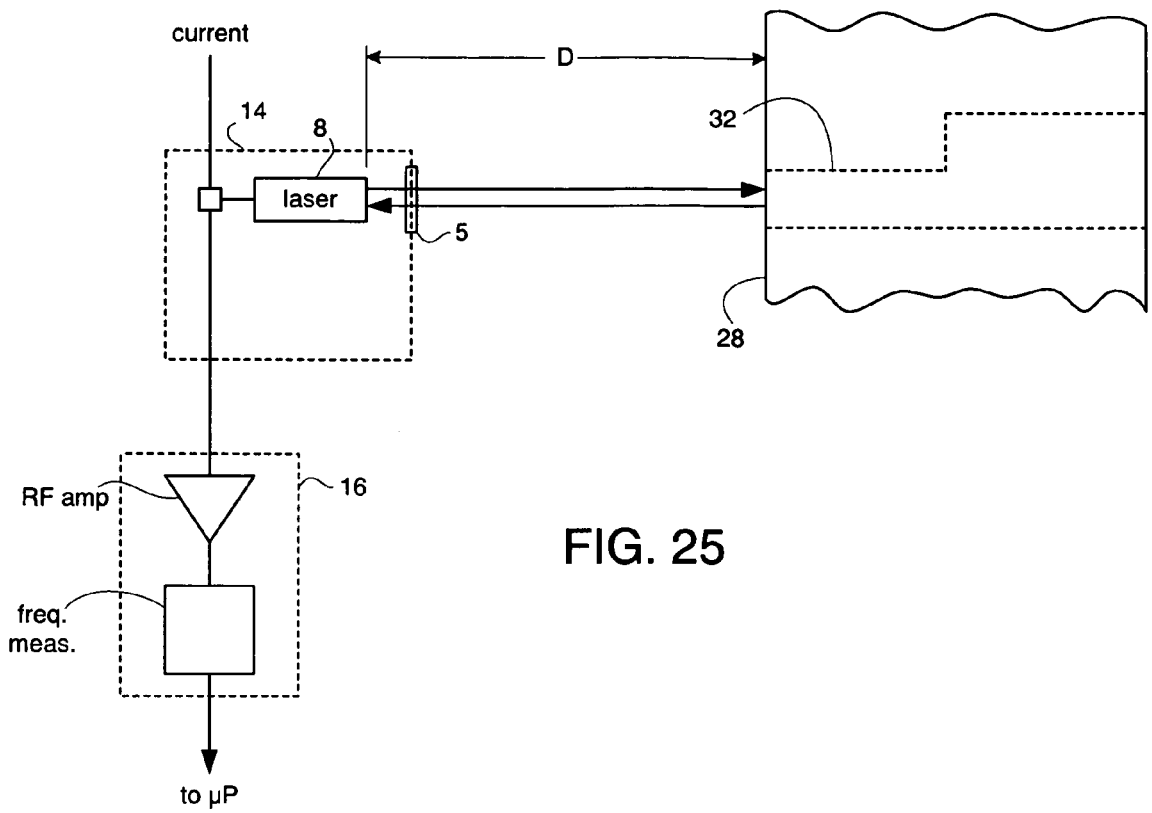

In at least some embodiments, and as shown in FIG. 25, distance between a sensor 14 and a target 32 attached to a key plunger 28 is determined using a cavity-resonant optical position sensor similar to the type described by R. P. Griffiths, C. Mignosi and I. H. White in *Cavity-Resonant Optical Position Sensor—A New Type of Optical Position Sensor*, in CLEO 1998 Technical Digest, Paper CThB4, May 3-8, 1998, page 328, incorporated by reference herein. A sensor 14 in the embodiment of FIG. 25 includes a laser diode 8 and a collimating lens 5. Current is applied to the laser diode 8 such that laser energy from the diode, after reflecting back from target 32 and striking the diode, causes the laser to oscillate in a number of modes. The number of oscillation modes is established by the distance D between diode 8 and target 32. These lasing modes create an RF signal within the laser diode. This RF signal results in a variation in the junction voltage for the laser diode. Peaks in the RF spectrum of this junction voltage have frequencies approximately corresponding to the theoretical round-trip delay for the laser-target distance. The frequencies are amplified and measured in detection circuitry 16, and a distance between the laser and target determined.

Figure 26:
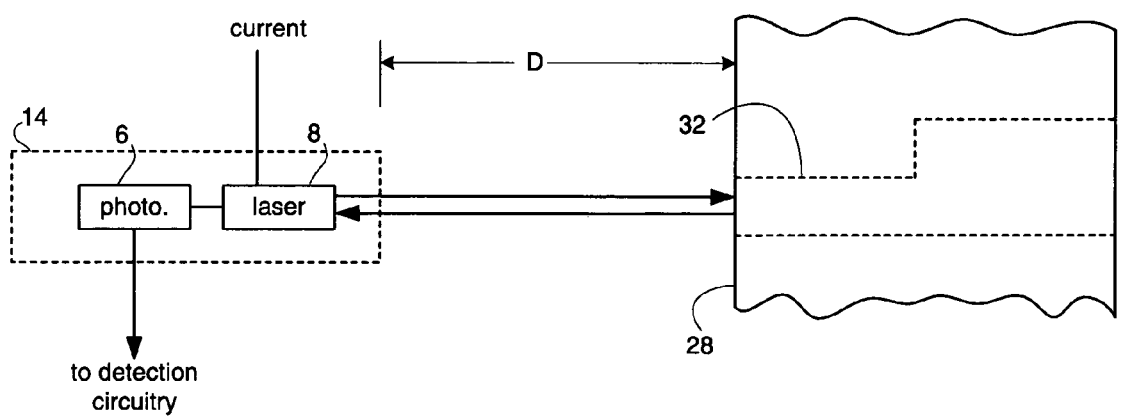

In at least some embodiments, one or more sensors 14 in a keyboard operates as part of a self-mixing laser range finder (FIG. 26). Self-mixing laser range finders are described in, e.g., E. Gagnon and J. Rivest, *Laser Range Imaging Using the Self-Mixing Effect in a Laser Diode*, IEEE Transactions on Instrumentation and Measurement, Vol. 48, No. 3 (June 1999), incorporated by reference herein. The output power P of a laser diode 8 is measured by a photodiode 6 (which may be packaged with laser diode 8). Using this power output, the laser-target distance D can be determined according to Equation (3).

$$D = \frac{C}{2K_1 * p_{avg}} \qquad \text{Equation (3)}$$

In Equation (3), C is the speed of light in free space, $K_1$ is a proportionality constant representing frequency excursion induced by the modulating signal, and $p_{avg}$ is an average overall spacing between peaks of a derivative of the output power of photodiode 6.

Figure 27:
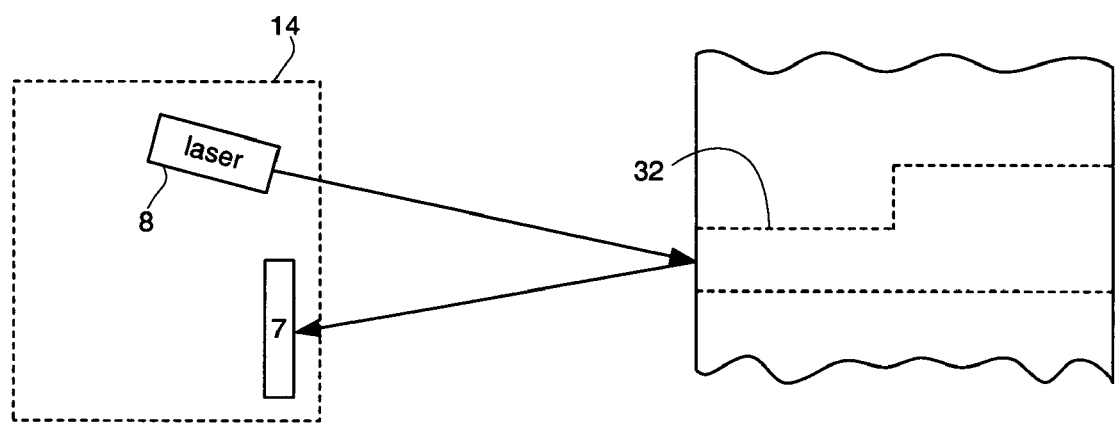

In at least some embodiments, and as shown in FIG. 27, sensor 14 forms part of a laser triangulation range finder. A laser beam from laser diode 8 shines onto target 32 and is reflected onto an array of light detectors 7. Light detectors 7 may be a charge-coupled device (CCD), an array of complementary metal oxide semiconductor (CMOS) photodiodes, etc. Using the distance between laser diode 8 and the light detectors in array 7 receiving the reflection, together with the angle between the emitted and reflected light, the distance to target 32 is determined.

Although examples of carrying out the invention have been described, those skilled in the art will appreciate that there are numerous variations and permutations of the above described devices that fall within the spirit and scope of the invention as set forth in the appended claims. The invention is not limited to keyboards, and includes other types of input devices in which a user may manipulate keys, buttons, levers, switches or other types of control pieces, and where movement of such control pieces is detected using one or more distance measuring techniques. As but one example of permutations and variations within the scope of the invention, numerous other range finding techniques could be utilized. Such techniques include, but are not limited to, multi-wavelength interferometry, non-coherent light time-of flight measurement, acoustic range finding, and infrared range detection (e.g., as used in distance measuring sensors available from Sharp Microelectronics of the Americas, of Camas, Wash.). Combinations of range finding techniques can be used in a single keyboard or other input device. Other features described herein can similarly be combined.

The invention claimed is:

1. A keyboard for providing input to a computer or other device, comprising:
   a plurality of keys, each key of the plurality being movable so as to place within a detection region a target coupled to the key, the target including a first face and a second face;
   a range finder having a first sensor positioned to detect the target placed in the detection region when a key of the plurality is pressed, the range finder determining a distance from the first sensor to the first face of the target when the key of the plurality is moved to a position that reflects light from the first face of the target to the first sensor, the range finder also determining a distance from the first sensor to the second face of the target when the key of the plurality is moved to a position that reflects light from the second face of the target to the first sensor, the target being positioned such that the first face of said target is closer to the first sensor than the second face of said target; and
   a controller receiving distance data from the range finder and configured to identify the moved key based upon the received distance data, the controller being configured to determine whether the key of the plurality has been pressed or released, and the controller being configured to determine a direction of key movement based on a temporal order in which distance data is received for the first and second faces of the target.

2. The keyboard of claim 1, wherein the range finder is a laser range finder.

3. The keyboard of claim 1, wherein the plurality of keys are generally aligned with the first sensor, and wherein simultaneous movement of at least two of said keys is detectable by the range finder.

4. The keyboard of claim 1, wherein:
   each key of the plurality is coupled to a separate extension member,
   each extension member holds one of the coupled targets,
   each of the coupled targets has a relative position within the extension member holding said coupled target, and
   at least one of the coupled targets has a relative position different from the relative position of another coupled target.

5. The keyboard of claim 4, wherein each extension member is a plunger attached to the underside of a different one of the plurality of keys, and wherein the relative position of each coupled target includes a location along an axis generally perpendicular to a face of the key attached to the plunger holding the coupled target.

6. The keyboard of claim 4, wherein:
   the plurality of keys includes first, second and third keys respectively coupled to first, second and third targets, and
   each of the first, second and third targets has a relative position different from the others of the first, second and third targets.

7. The keyboard of claim 1, wherein the range finder includes a second sensor positioned to detect a target placed in the detection region, and wherein the plurality of keys are generally aligned with the first and second sensor.

8. The keyboard of claim 1, wherein the controller is further configured to:
   store for each key of the plurality data indicative of whether the key is in a pressed or un-pressed condition,
   determine, upon receiving distance data indicating a first key of the plurality is being released, whether stored data indicates the first key was previously in a pressed condition, and
   ignore, based on the absence of data indicating the first key was previously in a pressed condition, the received distance data indicating release.

9. The keyboard of claim 1, wherein the controller is further configured to:
   store for each key of the plurality data indicative of whether the key is in a pressed or un-pressed condition,
   determine, upon receiving distance data indicating a first key of the plurality is being released, whether stored data indicates another key of the plurality maskable by the first key is in a pressed condition, and
   store, upon locating stored data indicating a key maskable by the first key is in a pressed condition, and without awaiting distance data indicating the maskable key is being released, data indicating the first key and the maskable key are in an un-pressed condition.

10. The keyboard of claim 1, further comprising an additional moveable member having an additional target coupled thereto, wherein:
    the controller is configured to receive additional distance data indicating the distance between the additional target and a reference location, and
    the controller is further configured to map the additional distance data to one of at least three values for output to a computer or other device.

11. The keyboard of claim 10, further comprising a second sensor positioned to detect the additional target, and wherein:
    movement of the additional moveable member changes the distance between the additional target and the second sensor, and
    the reference location is a location of a portion of the second sensor.

12. The keyboard of claim 1, further comprising a plurality of sensors positioned to detect an object within a second detection region, and wherein the controller is further configured to:
    receive additional distance data corresponding to location of an object detected within the second detection region by sensors of the plurality, and
    convert the additional distance data to pointing device data for transmission to a computer or other device.

13. The keyboard of claim 1, wherein the controller is further configured to determine velocity for a moving coupled target.

14. The keyboard of claim 1, wherein the controller is further configured to determine acceleration for a moving coupled target.

15. The keyboard of claim 1, further comprising a laser diode and plural optical fibers coupled to the laser diode, and wherein:
the first sensor comprises one of the plural optical fibers, and
others of the plural optical fibers form additional sensors.

16. The keyboard of claim 1, wherein:
a first target coupled to a first key of the plurality has a first unique shape,
a second target coupled to a second key of the plurality has a second unique shape,
the controller is configured to identify the first key based on distance data corresponding to the first unique shape, and
the controller is configured to identify the second key based on distance data corresponding to the second unique shape.

17. An apparatus, comprising:
a housing;
a detection region located within the housing;
a ranging device position to generate a signal that varies based on distances between a portion of the device and one or more objects within the detection region;
at least one independently movable control piece, wherein:
the at least one control piece is coupled to the housing, the at least one control piece comprising a first and a second face wherein the first face is closer to the portion of the ranging device than the second face, the at least one control piece has an attached detectable member, and the detectable member is, upon movement of the at least one control piece, repositioned within the detection region; and a controller configured to:
receive, upon movement of the at least one control piece, ranging data from the ranging device indicative of a repositioning of the detectable member, and
convert the distance data into a signal corresponding to the moved at least one control piece, the controller being further configured to determine whether a control piece of the plurality has been pressed or released, and further to determine a direction of key movement based on a temporal order in which distance data is received for the first and second faces of the control piece.

18. The apparatus of claim 17, wherein the ranging device is a laser range finder.

19. The apparatus of claim 17, wherein the at least one control piece comprises a plurality of control pieces generally aligned with the ranging device, and wherein simultaneous movement of at least two of said control pieces is detectable by the ranging device.

20. The apparatus of claim 17, wherein:
the at least one control piece comprises a plurality of control pieces,
each control piece of the plurality is coupled to a separate extension member,
each extension member holds a detectable member,
each of the detectable members has a relative position within the extension member holding said detectable member, and
at least one of the detectable members has a relative position different from the relative position of another detectable member.

21. The apparatus of claim 17, wherein:
the at least one control piece comprises a plurality of control pieces,
each control piece of the plurality has an attached detectable member, and
the controller is further configured, as to at least one control piece of the plurality, to map at least three values to ranging data for the detectable member coupled to the at least one control piece of the plurality.

22. The apparatus of claim 17, wherein the controller is further configured to:
receive additional ranging data corresponding to a position of an object detected within a second detection region by additional ranging devices, and
convert the additional ranging data to pointing device data for transmission to a computer or other device.

23. The apparatus of claim 17, wherein the ranging device comprises a laser light source coupled to a plurality of optical fibers, each of said optical fibers forming a sensor for detecting objects within different regions of the detection region.

24. The apparatus of claim 17, wherein:
the at least one control piece comprises a plurality of control pieces,
a first detectable member coupled to a first control piece of the plurality has a first unique shape,
a second detectable member coupled to a second control piece of the plurality has a second unique shape,
the controller is configured to identify the first control piece based on ranging data corresponding to the first unique shape, and
the controller is configured to identify the second control piece based on ranging data corresponding to the second unique shape.

25. The apparatus of claim 17, wherein:
the at least one control piece comprises a plurality of control pieces,
each control piece of the plurality has an attached detectable member,
the plurality of control pieces are arranged substantially in a line,
the ranging device includes a plurality of sensors each emitting a laser beam, the sensors being positioned such that the emitted beams are substantially parallel to one another and to the line of control pieces,
the detectable members are attached to the control pieces by extension members, the extension members for a first set of the control pieces being offset from the extension members for a second set of the control pieces, and
the extension members for the first set of the control pieces are in the path of one of the beams and the extension members for the second set of the control pieces are in the path of another of the beams.

26. The apparatus of claim 17, wherein:
the at least one control piece comprises first and second control pieces,
the first control piece includes a first extension member holding a first detectable member having a first height,
the second control piece includes a second extension member holding a second detectable member having a second height,
the ranging device includes a laser range finder having a sensor emitting a laser beam, the laser beam having a beam height,
first height is less than the second height, and
the second height is less than the laser beam height.

* * * * *